(12) United States Patent
Ferris et al.

(10) Patent No.: US 10,967,492 B2
(45) Date of Patent: Apr. 6, 2021

(54) STAPLE GUN WITH AUTOMATIC DEPTH ADJUSTMENT

(71) Applicant: Brahma Industries LLC, Jackson, WY (US)

(72) Inventors: Mark Ferris, Jackson, WY (US); Eric A. Miller, Jr., Wellesley, MA (US); John D. Fiegener, Marblehead, MA (US); Marcus R. Hanna, South Boston, MA (US); Ryan Thompson, Somerville, MA (US); William P. Liteplo, Middleton, MA (US)

( * ) Notice: Subject to any disclaimer, the term of this patent is extended or adjusted under 35 U.S.C. 154(b) by 59 days.

(21) Appl. No.: 16/195,154

(22) Filed: Nov. 19, 2018

(65) Prior Publication Data
US 2020/0156230 A1    May 21, 2020

(51) Int. Cl.
*B25C 7/00* (2006.01)
*B25C 5/06* (2006.01)
*B25C 5/15* (2006.01)
*G01R 19/155* (2006.01)

(52) U.S. Cl.
CPC .............. *B25C 7/00* (2013.01); *B25C 5/06* (2013.01); *B25C 5/15* (2013.01); *G01R 19/155* (2013.01)

(58) Field of Classification Search
CPC .... B25C 7/00; B25C 5/06; B25C 5/15; G91R 19/155
USPC .............................................. 227/130, 131, 8
See application file for complete search history.

(56) References Cited

U.S. PATENT DOCUMENTS

| | | | | |
|---|---|---|---|---|
| 2,585,942 A | * | 2/1952 | Juilfs | B25C 5/16 227/130 |
| 3,589,587 A | * | 6/1971 | Manganaro | B25C 1/06 227/131 |
| 4,349,143 A | | 9/1982 | Ewig | |
| 4,946,087 A | * | 8/1990 | Wingert | B25C 5/15 227/131 |
| 4,953,774 A | | 9/1990 | Lai | |
| 5,004,140 A | | 4/1991 | Fushiya et al. | |
| 5,118,023 A | | 6/1992 | Fushiya et al. | |

(Continued)

OTHER PUBLICATIONS

Makita, Makita XTS01Z 18V LXT Crown Stapler, www.amazon.com/Makita-XTS01Z-18V-Crown-Stapler/dp/B00U2LVX3A, 7 pages, publicly available as of Aug. 22, 2017.

(Continued)

*Primary Examiner* — Nathaniel C Chukwurah
(74) *Attorney, Agent, or Firm* — Sand, Sebolt & Wernow Co., LPA

(57) ABSTRACT

A staple gun and a method of using the same. A stapling mechanism in the housing is activated to deliver a staple through an aperture in a housing wall and drive the staple into a surface around a stack of one or more electric cables. The gun includes a reciprocating cable guide for centering the gun on the stack of cables and closing a safety switch to permit the gun's trigger to be activated. A spacer extending outwardly from the housing wall rests on the upper surface of the cable stack. The spacer and a bumper that engages a hammer of the stapling mechanism provide for automatic depth adjustment when driving the staple into the surface. A reciprocating cable guard extending outwardly from the housing wall is positioned between the stack of cables and the staple to aid in preventing the staple from piercing the cable.

15 Claims, 13 Drawing Sheets

(56) References Cited

U.S. PATENT DOCUMENTS

| | | |
|---|---|---|
| 5,735,444 A | 4/1998 | Wingert |
| 5,918,790 A | 7/1999 | Donnell |
| 6,006,704 A | 12/1999 | Phillips et al. |
| 6,016,946 A | 1/2000 | Phillips et al. |
| 6,481,612 B1 | 11/2002 | Mangone, Jr. |
| 6,837,412 B2 | 1/2005 | Lamb |
| 6,971,567 B1 | 12/2005 | Cannaliato et al. |
| 7,137,541 B2 | 11/2006 | Baskar et al. |
| 7,165,305 B2 | 1/2007 | Kenney et al. |
| 7,225,959 B2 | 6/2007 | Patton et al. |
| 7,322,506 B2 | 1/2008 | Forster |
| 7,445,139 B2 | 11/2008 | Okouchi |
| 7,494,035 B2 | 2/2009 | Weaver et al. |
| 7,527,106 B2 | 5/2009 | Miller et al. |
| 7,537,145 B2 | 5/2009 | Gross et al. |
| 7,556,184 B2 | 7/2009 | Brendel et al. |
| 7,562,801 B2 | 7/2009 | Pelletier et al. |
| 7,641,089 B2 | 1/2010 | Schell et al. |
| 7,646,157 B2 | 1/2010 | Cruise et al. |
| 7,665,540 B2 | 2/2010 | Gross et al. |
| 7,793,811 B1 | 9/2010 | Pedicini et al. |
| 7,913,890 B2 | 3/2011 | Gross et al. |
| 7,918,374 B2 | 4/2011 | Gardner et al. |
| 7,938,305 B2 | 5/2011 | Simonelli et al. |
| 7,975,893 B2 | 7/2011 | Berry et al. |
| 8,011,549 B2 | 9/2011 | Berry et al. |
| 8,025,197 B2 | 9/2011 | Brendel et al. |
| 8,079,504 B1 | 12/2011 | Pedicini et al. |
| 8,123,099 B2 | 2/2012 | Kenney et al. |
| 8,167,183 B2 | 5/2012 | Matsunaga et al. |
| 8,210,409 B2 | 7/2012 | Hirabayashi |
| 8,215,528 B2 | 7/2012 | Matsunaga et al. |
| 8,225,978 B2 | 7/2012 | Gross et al. |
| 8,231,039 B2 | 7/2012 | Buck et al. |
| 8,302,833 B2 | 11/2012 | Gross et al. |
| 8,387,847 B2 | 3/2013 | Hachisuka |
| 8,413,867 B2 | 4/2013 | Gardner et al. |
| 8,439,242 B2 | 5/2013 | Tanji et al. |
| 8,453,901 B2 | 6/2013 | Suda |
| 8,523,035 B2 | 9/2013 | Pedicini et al. |
| 8,534,527 B2 | 9/2013 | Brendel et al. |
| 8,550,323 B2 | 10/2013 | Fujimoto |
| 8,631,986 B2 | 1/2014 | Hlinka et al. |
| 8,690,036 B2 | 4/2014 | Schell et al. |
| 8,698,022 B2 | 4/2014 | Kawakami |
| 8,733,610 B2 | 5/2014 | Pedicini |
| 8,800,834 B2 | 8/2014 | Pedicini et al. |
| 8,875,969 B2 | 11/2014 | Pedicini et al. |
| 8,899,460 B2 | 12/2014 | Wojcicki |
| 8,939,340 B2 | 1/2015 | Gardner et al. |
| 8,939,341 B2 | 1/2015 | Pedicini et al. |
| 8,939,342 B2 | 1/2015 | Brendel et al. |
| 8,985,424 B2 | 3/2015 | Miyashita |
| 9,346,157 B2 | 5/2016 | Morioka et al. |
| 9,346,158 B2 | 5/2016 | Garber et al. |
| 9,399,281 B2 | 7/2016 | Brendel et al. |
| 9,425,730 B2 | 8/2016 | Sako et al. |
| 9,469,021 B2 | 10/2016 | Gregory et al. |
| 9,486,904 B2 | 11/2016 | Gregory et al. |
| 9,486,905 B2 | 11/2016 | Baskar et al. |
| 9,498,871 B2 | 11/2016 | Gregory et al. |
| 9,577,493 B2 | 2/2017 | Ekstrom et al. |
| 2008/0179371 A1* | 7/2008 | Gardner .................. F16L 3/04 227/1 |
| 2009/0321495 A1 | 12/2009 | Hirabayashi et al. |
| 2010/0065294 A1 | 3/2010 | Hirabayashi |
| 2012/0111915 A1 | 5/2012 | Miyashita |
| 2013/0098963 A1 | 4/2013 | Gardner et al. |
| 2013/0300333 A1 | 11/2013 | Sako et al. |
| 2013/0320060 A1 | 12/2013 | Gregory et al. |
| 2013/0320063 A1 | 12/2013 | Gregory et al. |
| 2013/0320064 A1 | 12/2013 | Gregory et al. |
| 2013/0320066 A1 | 12/2013 | Gregory et al. |
| 2013/0320067 A1 | 12/2013 | Gregory et al. |
| 2014/0001224 A1 | 1/2014 | McNeill et al. |
| 2014/0097223 A1 | 4/2014 | Baron et al. |
| 2014/0158740 A1 | 6/2014 | Akutsu et al. |
| 2015/0096776 A1 | 4/2015 | Garber |
| 2015/0122868 A1 | 5/2015 | Campbell |
| 2015/0298308 A1 | 10/2015 | Kato |
| 2016/0241178 A1 | 8/2016 | Fujinami et al. |
| 2016/0359343 A1 | 12/2016 | Ito et al. |
| 2017/0060471 A1 | 3/2017 | Yamamoto et al. |
| 2017/0129085 A1 | 5/2017 | Miyashita et al. |
| 2017/0217004 A1 | 8/2017 | Kato |

OTHER PUBLICATIONS

Arrow Fastener, Cordless Electric Staple Gun-T50DCD, www.homedepot.com/p/Arrow-Fastener-Cordless-Electric-Staple-Gun-T50DCD/300126668, 2 pages, publicly available as of Aug. 22, 2017.

* cited by examiner

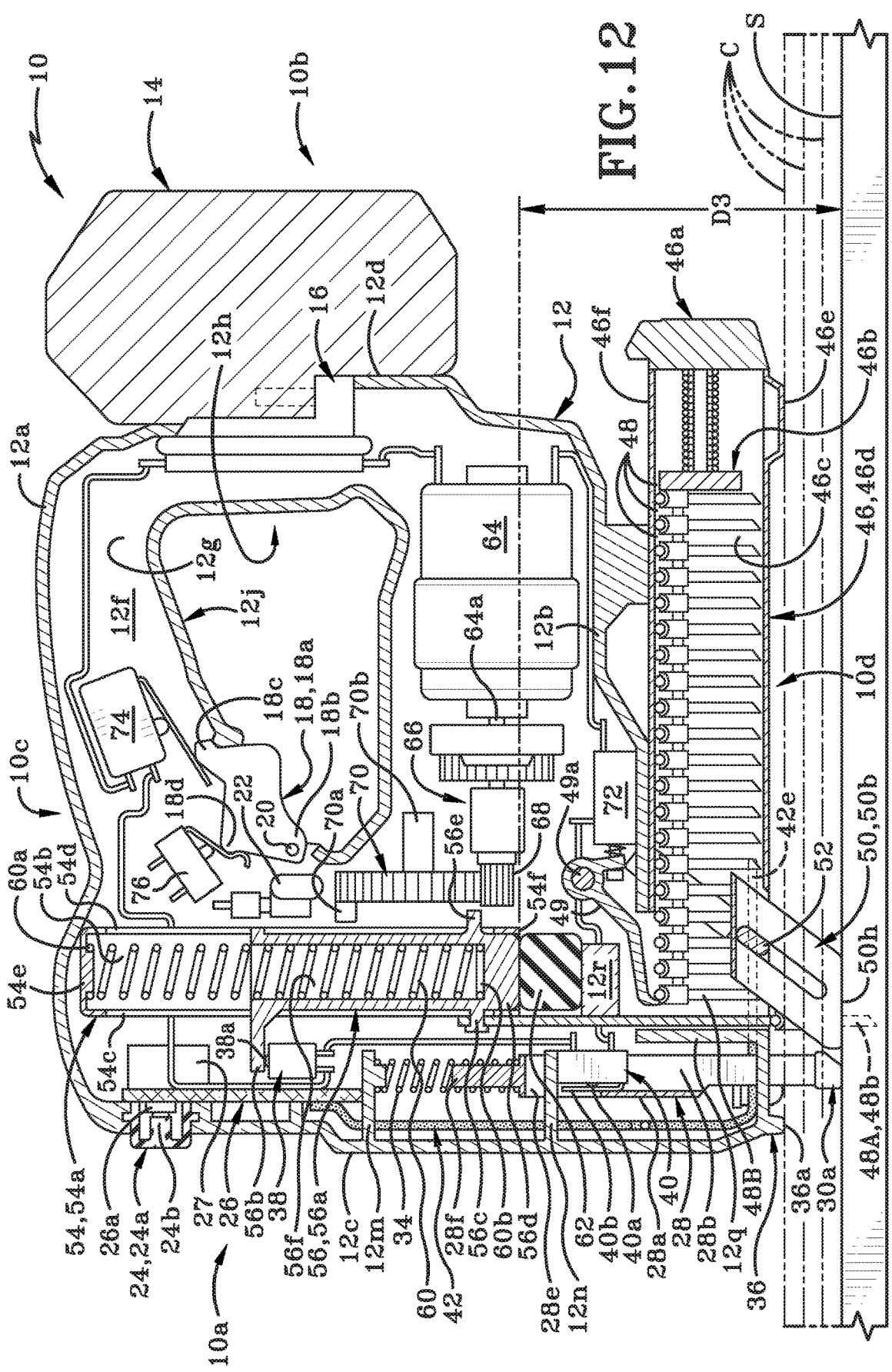

STAPLE GUN WITH AUTOMATIC DEPTH ADJUSTMENT

TECHNICAL FIELD

This disclosure relates generally to power tools. More particularly, this disclosure is directed to staple guns. Specifically, this disclosure relates to a powered staple gun that has a mechanism for centering the gun over a stack of one or more electric cables; where the gun is able to automatically adjust a depth to which staples are driven into a surface around a stack of one or more electric cables; and where the gun includes a cable guard that aids in preventing tips of the staples from piercing insulation provided around an electric cable, among other safety features.

BACKGROUND

Background Information

When electric cables are installed in buildings they typically have to be secured to surfaces, such as wood studs, to keep them in place. The electric cables, such as ROMEX® cables, are typically surrounded by insulation and may come in a variety of different widths and thicknesses. (ROMEX® is a registered trademark of Southwire Company, LLC of Carrollton, GEORGIA, USA.) A common way for securing electric cables to surfaces is to staple them in place, particularly with insulated staples. When the staples are installed, care has to be taken to ensure that the tips of the staples do not pierce the cable insulation and that the staple is not driven so far into the surface that the cable's insulation is cut and/or that the cable is crushed.

One of the issues with using electrically powered staple guns is that they drive the staples into the surface with such force that it is difficult to control the depth to which the staples enter the surface. There is also a risk that a staple will be fired before the installer has correctly positioned the gun and this might lead to the staple being driven into the cable itself. In order to mitigate these issues, installers may tend to put previously known electric staple guns on one side and simply use a hammer to drive staples into place over electrical cables.

SUMMARY

There is therefore a need in the art for an improved electric staple gun that that overcomes some of the shortcomings of the prior art. The staple gun disclosed herein includes features that address some of these shortcomings. The staple gun has a housing with an exterior wall that defines at least one aperture therein. A stapling mechanism provided in the housing is activated to deliver a staple through an aperture in the housing wall and to drive the staple into a surface around a stack of one or more electric cables. The gun includes a reciprocating cable guide for centering the gun on the stack of cables and closing a safety switch to permit the gun's trigger to be activated, thereby delaying firing of the gun until the installer is ready to install a staple. By centering the gun over the electric cables, the cable guide helps to ensure that a staple will not be accidentally driven into a cable. A spacer extending outwardly from the housing wall rests on the upper surface of the cable stack. The spacer and a resilient bumper that engages a hammer of the stapling mechanism provide for automatic depth adjustment when driving the staple into the surface. The spacer and bumper ensure help to ensure that the staple is not driven to such a depth into the surface that the cable is crushed or pierced. A reciprocating cable guard extending outwardly from the housing wall is positioned between the stack of cables and the tips of a staple. The cable guard help to prevent the staple from accidentally piercing the cable in that the cable guard is positioned to deflect the tips of the staple arms away from the insulation surrounding the electric cables. Other features of the staple gun disclosed herein include the provision of a sensor probe that detects if current is flowing through a cable in the stack of cables. If current is detected, the sensor probe signals a printed circuit board (PCB) resulting in the gun's trigger being disabled. An override button may be provided that may be depressed to override the signal from the sensor probe to the PCB in order to make it possible that the trigger is not deactivated. Other features on the gun include an alarm generating mechanism that is activated when current is detected in a cable and/or when the override button is activated.

In one aspect, the present disclosure may provide a staple gun comprising a housing; a wall provided on the housing; said wall defining an aperture therein; a stapling mechanism provided in the housing, said stapling mechanism being adapted to deliver a staple through the aperture and around a stack of one or more cables resting on a surface; and a cable guide provided in the housing and being selectively movable in one of a first direction and a second direction relative to the housing; wherein the cable guide has a first leg and a second leg that are spaced a distance apart from each other; wherein the first leg and second leg are positioned to move through the aperture and are adapted to straddle the stack of one or more cables.

In one aspect, the present disclosure may provide a method of centering a staple gun over a stack of one or more electric cables resting on a surface comprising extending a first leg and a second leg of a cable guard outwardly from an aperture defined in a wall of a housing of a staple gun; placing an interior surface of the first leg adjacent a first side surface of a stack of one or more electric cables; placing an interior surface of the second leg adjacent a second side surface of the stack of one or more electric cables; and capturing the stack of one or more electric cables between the first leg and the second leg.

The method may further comprise resting a bottom surface of a spacer extending outwardly from the wall onto an upper surface of the stack of one or more electric cables. The method may further comprise moving the staple gun downwardly toward the upper surface of the stack of one or more electric cables. The method may further comprise locating a protrusion on the wall of the housing a distance rearwardly of the spacer; and placing a terminal end of the protrusion on the upper surface of the stack of one or more electric cables. The method may further comprise moving the cable guard inwardly into the housing of the staple gun as the staple gun is moved downwardly towards the upper surface of the stack of one or more electric cables; and adjusting a distance that the first leg and the second leg extend outwardly from the wall as the cable guard is moved. The method may further comprise adjusting the distance to a first distance when the stack of one or more electric cables comprises a single cable; adjusting the distance to a second distance when the stack of one or more electric cables comprises two cables; and adjusting the distance to a third distance when the stack of one or more electric cables comprises three cables; wherein the third distance is greater than the second distance, and the second distance is greater than the first distance.

The method may further comprise moving a safety switch to a closed position with the cable guard as the cable guard moves inwardly into the housing. The method may further comprise activating a trigger on the stapling mechanism when the safety switch is moved to the closed position; and firing a staple around the stack of one or more cables and into the surface using a stapling mechanism provided in the housing. The firing of the staple comprises moving a hammer of the stapling mechanism in a direction toward an upper surface of the staple; contacting the upper surface of the staple with a first portion of the hammer; and driving the staple into the surface upon which the stack of one or more cables rest. The method may further comprise limiting a distance to which arms of the staple are driven into the surface. The limiting may comprise striking a resilient bumper located in the housing with a second portion of the hammer. The method may further comprise moving the safety switch to an open position with the cable guard as the cable guard moves further outwardly from the aperture in the wall; deactivating the trigger; and preventing the firing of a staple from the stapling mechanism. The method may further comprise detecting whether or not current is flowing through a cable in the stack of one or more electric cables. The detecting may comprise positioning a sensor probe adjacent the wall and in a direction substantially parallel to a longitudinal axis of the housing; wherein the longitudinal axis extends from a front end of the housing to a rear end of the housing.

In one aspect, the present disclosure may provide a staple gun comprising a housing defining an interior cavity; a wall provided on the housing; said wall defining an aperture therein; a stapling mechanism provided in the interior cavity of the housing; said stapling mechanism being adapted to deliver a staple through the aperture and over a stack of one or more cables resting on a surface; wherein the stapling mechanism includes a hammer that is movable in one of a first direction and a second direction relative to the wall; said hammer being adapted to strike the staple and drive the same into the surface when moving in the second direction; and a resilient bumper spaced a distance inwardly from an interior surface of the wall; wherein the bumper is contacted by the hammer and stops movement of the hammer in the second direction during the strike of the hammer on the staple.

In one aspect, the present disclosure may provide a method of setting a depth to which a staple is driven into a surface comprising positioning a stack of one or more cables on a surface; positioning a staple gun over the stack of one or more cables; activating a stapling mechanism within the staple gun; moving a hammer of the stapling mechanism in a first direction away from a wall of the staple gun; loading the hammer as the hammer is moved in the first direction; releasing the loaded hammer; moving the hammer in a second direction toward the wall of the staple gun; striking a staple with a portion of the hammer as the hammer moves in the second direction; driving a part of the staple into the surface; contacting a bumper with a bottom end of the hammer; stopping movement of the hammer in the second direction; and stopping movement of the staple into the surface.

The method may further comprise limiting an extent of travel of the hammer in the second direction by positioning the bumper a distance inwardly from an interior surface of the wall of the staple gun. The resting the wall of the staple gun on an upper surface of the stack of one or more cables prior to activating the stapling mechanism. The resting of the wall of the staple gun further comprises resting a spacer extending outwardly from the wall on the upper surface of the stack of one or more cable; and locating a remaining portion of the wall of the staple gun a distance off the surface upon which the stack of one or more cables rests, wherein the distance is equivalent to a height of the stack of one or more cables plus a height of the spacer.

In one aspect, the present disclosure may provide a staple gun comprising a housing defining an interior cavity; a wall provided on the housing; said wall defining an aperture therein; a stapling mechanism provided in the interior cavity of the housing; said stapling mechanism being adapted to deliver a staple through the aperture and over a stack of one or more cables resting on a surface; and a spacer extending downwardly for a distance beyond the wall of the housing that defines the aperture; wherein the spacer is adapted to rest on an upper surface of the stack of one or more cables and to retain the wall of the housing a distance from the surface that is equivalent to a height of the spacer plus a height of the stack of one or more cables.

In one aspect, the present disclosure may provide a staple gun comprising a housing defining an interior cavity; a stapling mechanism provided in the housing; a wall provided on the housing; said wall defining an aperture through which the stapling mechanism is adapted to deliver a staple to secure a stack of one or more cables to a surface; and a cable guard extending outwardly from the wall of the housing proximate of the aperture; wherein a portion of said cable guard is adapted to extend between a side surface of the stack of one or more cables and a portion of an arm of the staple.

In one aspect, the present disclosure may provide a method of protecting an electric cable during a stapling procedure comprising placing a stack of one or more electric cables onto a surface; contacting the surface with a bottom edge of a cable guard extending downwardly from a bottom wall of a housing of a staple gun; moving the staple gun downwardly toward the surface; moving the cable guard one of upwardly and downwardly relative to the bottom wall of the staple gun depending on a height of the stack of one or more electric cables; placing the bottom wall of a staple gun onto an upper surface of the stack of one or more electric cables; activating a stapling mechanism within the staple gun; loading a staple into a firing position within the staple gun; positioning the cable guard between at least one side of the stack of one or more electric cables and a portion of an arm of the staple; and driving the staple into the surface using the stapling mechanism.

The method may further comprise mounting the cable guard to the housing using a spring mechanism. The method may further comprise mounting the cable guard to the housing rearwardly of an aperture through which the staple is driven. The mounting and the positioning may further comprise providing a cable guard that is a parallelogram in shape when viewed from a left side or a right side and is generally U-shaped when viewed from a front; wherein the cable guard includes a top wall with a left side wall and a right side wall extending downwardly from proximate opposing ends of the top wall; securing the top wall to the housing; angling a portion of each of the left side wall and the right side wall downwardly and forwardly from the top wall; positioning the portion of left side wall between a tip of a left arm of the staple and a left side surface of the stack of one or more electric cables; and positioning the portion of the right side wall between a tip of a right arm of the staple and a right side surface of the stack of one or more electric cables.

The method may further comprise detecting whether current is flowing through the stack of one or more cables prior to activating the stapling mechanism. The method may further comprise activating an override button when current is detected as flowing through the stack of one or more cables. The method may further comprise generating an alarm when the override button is activated. The generating of the alarm includes one or more of illuminating a light emitting diode (LED) making an audible sound.

In one aspect, the present disclosure may provide a staple gun comprising a housing defining an interior cavity; a stapling mechanism provided in the housing; a wall provided on the housing; said wall defining an aperture therein through which staples are adapted to be delivered by the stapling mechanism to secure a stack of one or more electric cables to a surface; a printed circuit board (PCB) provided in the housing and being operatively engaged with the stapling mechanism; and a sensor probe operatively engaged with the PCB and extending along at least a portion of the wall of the housing; wherein the sensor probe is adapted to detect current flowing through the cable.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 9A is a perspective view of the cable guard shown on its own.

FIG. 12 is a longitudinal cross-section of the staple gun positioned over three electrical cables and being utilized to drive a staple into a surface.

Similar numbers refer to similar parts throughout the drawings.

DETAILED DESCRIPTION

Figure 1:
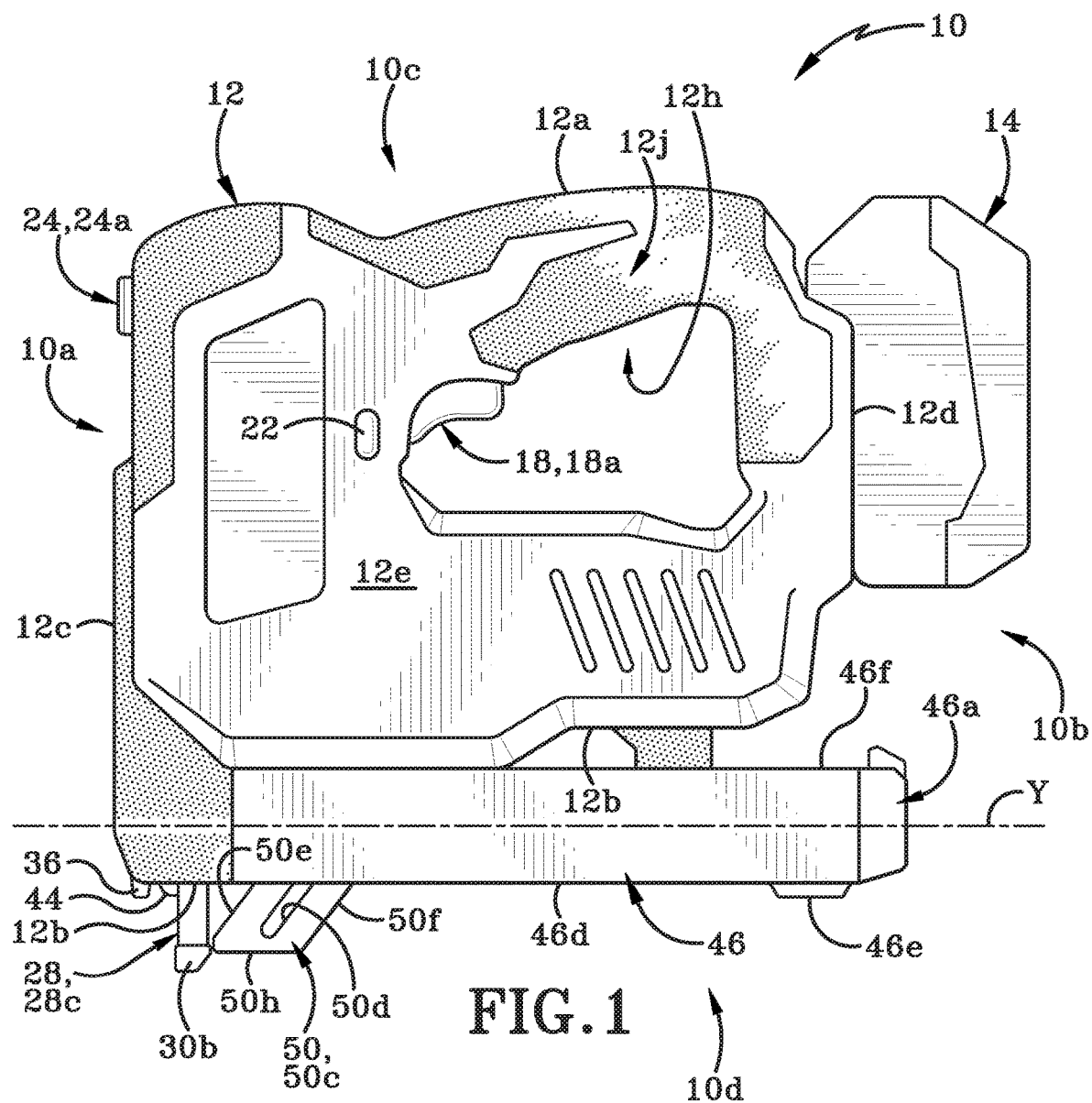
FIG. 1 is a left side elevation view of a first embodiment of a staple gun in accordance with an aspect of the present disclosure.

Referring to FIGS. 1-13, there is shown a first embodiment of a staple gun in accordance with an aspect of the present disclosure. The first embodiment of the staple gun is generally indicated by the reference number 10. In order to more clearly understand the attached figures, staple gun 10 is illustrated as having a front end 10a, a rear end 10b, a top 10c, a bottom 10d, a left side 10e (FIG. 3) and a right side 10f.

With reference to the attached figures, the front and rear ends 10a, 10b of staple gun 10 define a longitudinal direction between them; the top and bottom 10c, 10d define a vertical direction between them; and the left, and right sides 10e, 10f define a lateral direction between them.

Staple gun 10 includes a housing 12 within which a number of components are housed. A rechargeable battery pack 14 may be removably engaged with a battery mounting 16 provided on housing 12. Battery pack 14 may be utilized to power various components and operations of staple gun 10. Battery pack 14 may be selectively removed from battery mounting 16 in order to recharge the battery pack 14 on a specially designed remote recharging station (not shown). It should be understood that housing and battery pack of staple gun 10 may be of any desired shape, size, and configuration. The housing 12 and battery pack 14 illustrated herein are provided as an example of how the staple gun 10 may be arranged but the specific configuration of housing 12 and battery pack 14 should not be considered as unnecessarily limiting of the scope of the present disclosure.

Housing 12 may include a left-side housing and a right-side housing that are complementary in configuration and are designed to meet along a generally longitudinally-oriented midline plane and are secured to each other in any suitable manner. (Other ways of forming housing 12 may be utilized instead of utilizing a left-side housing and a right-side housing).

Figure 2:
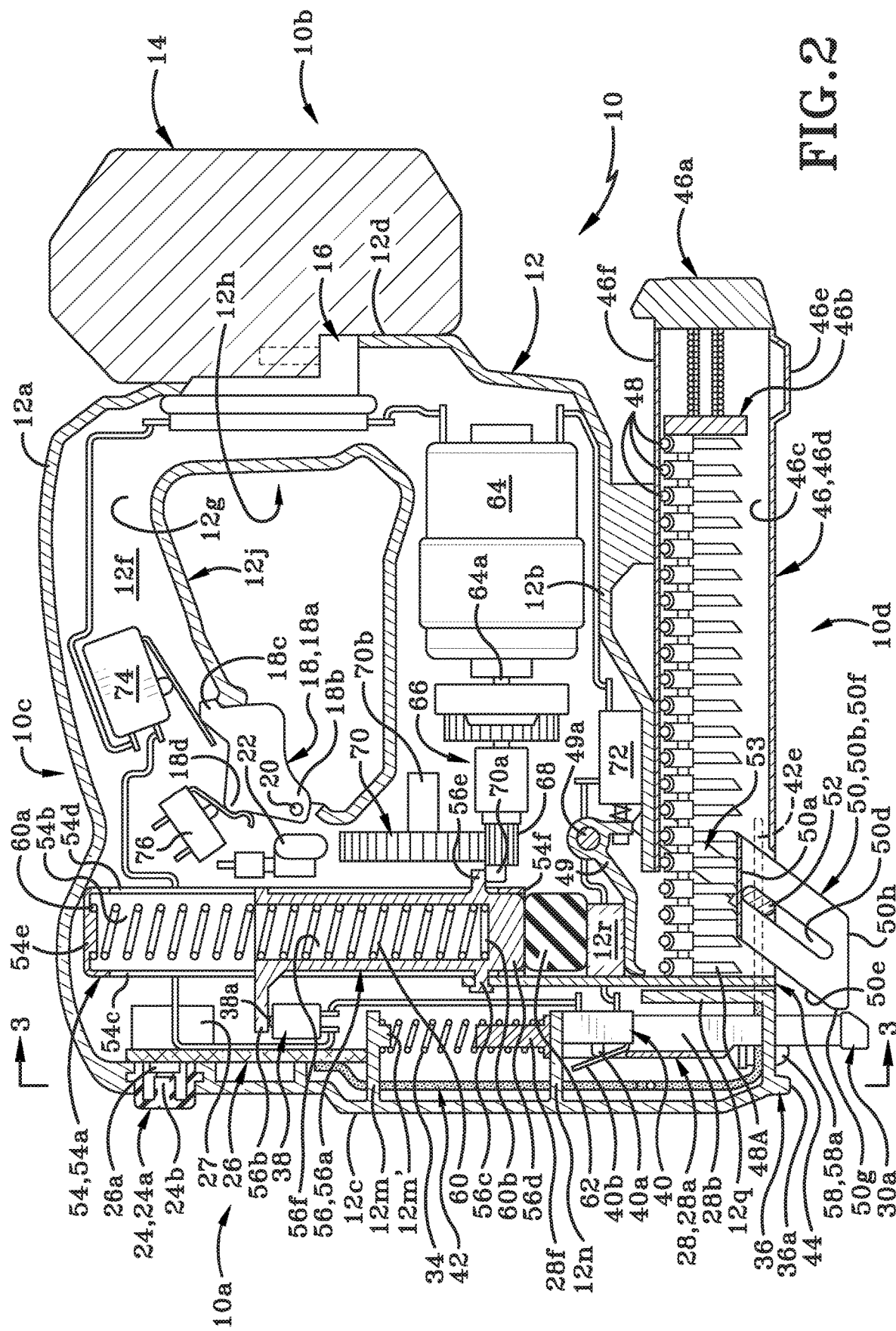
FIG. 2 is a longitudinal cross-section of the staple gun taken along line 2-2 of FIG. 1, where the staple gun is shown in an initial position prior to being positioned for use.
Figure 3:
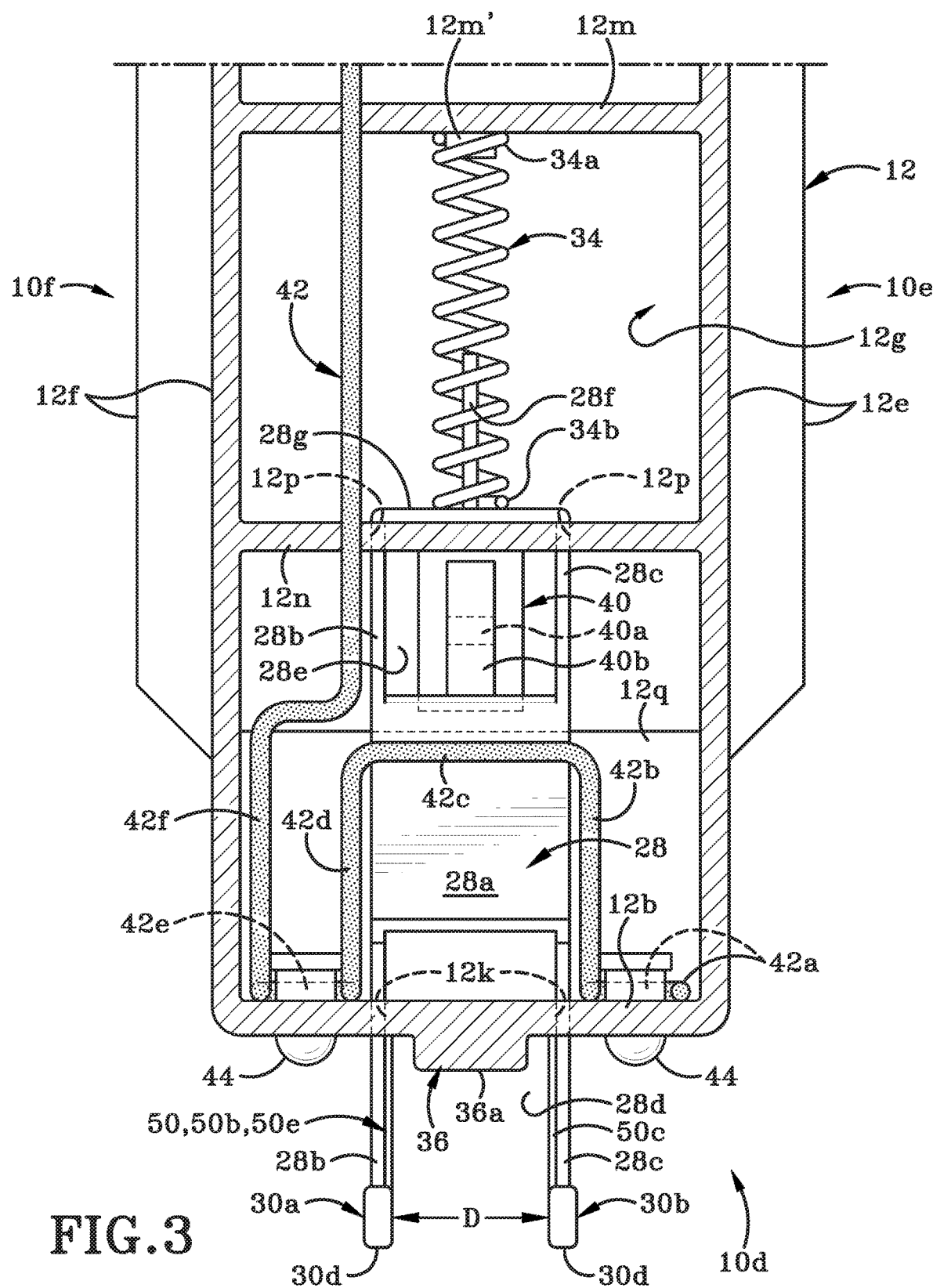
FIG. 3 is a cross-section of the staple gun in the initial position taken along line 3-3 of FIG. 2.

Housing 12 may include a top wall 12a, a bottom wall 12b, a front wall 12c, a rear wall 12d, a left side wall 12e, and a right side wall 12f (FIGS. 2 & 3). Battery pack 14 may be engaged with a portion of battery mounting 16 that is accessible on rear wall 12d. Top wall 12a, bottom wall 12b, front wall 12c, rear wall 12d, left side wall 12e, and right side wall 12f bound and define an interior cavity 12g (FIG. 2) within which a plurality of components are either partially or fully housed, as will be discussed hereafter.

An opening 12h is bounded and defined by a portion of each of the left-side housing and right-side housing. Opening 12h may be provided at a position intermediate top and bottom walls 2a, 12b and intermediate front and rear walls 12c, 12d. Opening 12h may furthermore extend from left side wall 12e through to right side wall 12f. Portions of housing 12 that bound and define opening 12h may form a handle region 12j (FIG. 1) that extends from top wall 12a to opening 12h. The handle region 12j may be utilized by an operator to hold staple gun 10 in a single hand if desired.

Handle region 12*j* may be ergonomically shaped to be comfortably held by a user. Furthermore, portions of an exterior surface of handle region 12*j* and portions of the rest of housing 12 may be covered by a material, such as rubber. This material may make handle region 12*j* easier and more comfortable to grip. The material may also be of a type that aids in preventing a user's hand from slipping while holding staple gun 10 using handle region 12*j*. The material on the rest of staple gun 10 may be provided to give staple gun 10 a more aesthetically appealing exterior surface. In other instances, this material may cover areas that may traditionally be contacted by an operator while operating staple gun, and will therefor help to ensure these contacted areas are less likely to cause an operator's hand to slip thereon.

A portion of bottom wall 12*b* proximate front wall 12*c* of housing defines one or more apertures 12*k* (FIG. 3) therein. Housing 12 is also molded to include a horizontally-oriented interior wall 12*m* (FIG. 2) that extends rearwardly from an interior surface of front wall 12*a* and toward rear wall 12*b*. Interior wall 12*m* may be positioned generally in vertical alignment with one or more apertures 12*k*. Interior wall 12*m* may include a vertically-oriented post 12*m*' extending downwardly therefrom. A second horizontally-oriented interior wall 12*n* may extend rearwardly from the interior surface of front wall 12 and toward rear wall 12*b*. Interior wall 12*n* may be spaced a distance vertically below interior wall 12*m* and may be generally vertically aligned with one or more apertures 12*k*. Interior wall 12*n* may define an opening 12*p* therein that extends from an upper surface thereof to a lower surface thereof. Opening 12*p* may be aligned with the one or more apertures 12*k* in bottom wall 12*b*. A vertically-oriented interior guide wall 12*q* is provided on housing 12 a spaced distance rearwardly from front wall 12*c*. Guide wall 12*q* extends upwardly from an interior surface of bottom wall 12*b* a distance rearwardly of a rearward region of bottom wall 12*b* that defines aperture 12*h*. The purpose of these various parts of housing 12 will be discussed later herein.

Referring to FIG. 1, housing 12 may have a number of components mounted thereon in such a way that the components may be readily visible and/or accessible. For example, a trigger 18 may be mounted via a pivot pin 20 (FIG. 2) to housing 12 so that part of trigger 18 is located inside interior cavity 12*g* and the rest of trigger 18 extends into opening 12*h*. When depressed to activate staple gun 10, part of trigger 18 may pivot and move further inwardly into interior cavity 12*g* and therefore protrude less into opening 12*h*. When later released, trigger 18 will pivot in the opposite direction and less of trigger 18 will be located inside interior cavity 12*g* and more of trigger 18 will extend into opening 12*h*. As shown in FIG. 2, trigger 18 may include a curved wall 18*a* in which a user will seat a finger. Wall 18*a* may be generally S-shaped and extend from a first region 18*b* that includes pivot pin 20 to a second region 18*c* that is located generally opposite to first region 18*b*. A second generally S-shaped wall extends from second region 18*c* to a third region 18*d*. Second region 18*c* and third region 18*d* serves purposes that will be disclosed later herein.

A second component that is located partially within interior cavity 12*g* and extends partially outwardly for a distance beyond the exterior surface of housing 12 is an ON-OFF switch 22. ON-OFF switch 22 may be of any suitable and desired construction. By way of example only, the switch 22 may be of a type that slides in a first direction to switch staple gun 10 on and that slides in a second direction to switch staple gun 10 off. Any other manner of activating switch 22 may be utilized instead of sliding the same back and forth. Switch 22 may be operatively engaged with a power source via wiring that is not shown in the figures so as to make the figures simpler and easier to understand. As indicated earlier herein, the power source illustrated in the attached figures may be the battery pack 14. It will be understood that in other examples, a different power source may be utilized instead of battery pack 14. For example, an electrical cord may be hard-wired to staple gun 10 and the cord may be plugged into a standard electrical outlet to provide power to staple gun 10.)

A third component that is located partially within interior cavity 12*g* and extends partially outwardly for a distance beyond the exterior surface of housing 12 is an override button 24. Override button 24 is illustrated as protruding outwardly from an upper region of front wall 12*c*. It will be understood, however, that override button 24 may be located at any other suitable location on housing 12. Override button 24 may include a cap region 24*a* (FIG. 2) and an electrical post 24*b*. Cap region 24*a* may be fabricated from a non-conductive material such as rubber.

A printed circuit board (PCB) 26 is positioned within interior cavity 12*g* inwardly of override button 24. PCB 26 is operatively engaged with a plurality of components on staple gun 10 and is provided with a microprocessor that controls the operation of staple gun 10. ON-OFF switch 22 is operatively engaged with PCB 26. If ON-OFF switch 22 is in an OFF position and a user depresses trigger 18, nothing will happen. Switch 22 has to be moved to the ON position for staple gun 10 to function.

PCB 26 includes an electrical contact 26*a* that is positioned to be aligned with post 24*b* of override button 24. When cap region 24*a* is depressed inwardly post 24*b* may be brought into electrical engagement with contact 26*a* thereby closing an override circuit. A noise-generating mechanism 27 is operatively engaged with PCB 26 and thereby with override button 24. The operation of override button 24 and noise-generating mechanism 27 will be is controlled by the microprocessor on PCB 26 and will be further described later herein.

Referring to FIGS. 1-3, a further component that is located partially within interior cavity 12*g* and partially extends outwardly therefrom is a cable guide 28. Cable guide 28 may be a spring-loaded component that may be utilized to hold a cable (i.e., cable) in a correct position on a surface so that there is a reduced possibility for staple gun 10 to accidentally pierce the cable with a staple that is fired from the staple gun 10.

Cable guide 28 includes a base having a front wall 28*a* (FIG. 3). Two spaced apart legs 28*b*, 28*c* extend downwardly from the base and through one or more apertures 12*k* (FIG. 3) in bottom wall 12*b* of housing 12. A gap 28*d* is defined between the first leg 28*b* and the second leg 28*c*. An opening 28*e* is defined in front wall 28*a*, with the opening 28*e* being located toward an upper region of the base. Opening 28*e* extends from a first surface of the base through to an opposed second surface of the base. A shaft 28*f* extends outwardly from an upper end 28*g* (FIG. 3) of the base and in an opposite direction to first leg 28*b* and second leg 28*c*. When cable guide 28 is placed within housing 28, first and second legs 28*b*, 28*c* extend downwardly and outwardly through the one or more apertures 12*k* in bottom wall 12*b*, and the upper region of the base extends through an opening 12*p* in interior wall 12*n* of housing 12. The post 28*f* extends upwardly toward interior wall 28*m* and is aligned with post 28*m*'.

A first foot 30*a* (FIG. 3) is provided on a lower end of the first leg 28*b* and a second foot 30*b* is provided on a lower end of the second leg 28*c*. First and second feet 30*a*, 30*b*, and a portion of first leg 28b and second leg 28c protrude through the one or more apertures 12k in the housing's bottom wall 12b. Feet 30a, 30b may be made of a resilient material, such as rubber. Feet 30a, 30b may cushion and protects the lowermost ends of first and second legs 28b, 28c. Feet 30a, 30b may also be fabricated to be a contrasting color to first and second legs 28b, 28c so that they are more readily seen by a user of staple gun 10.

Figure 5:
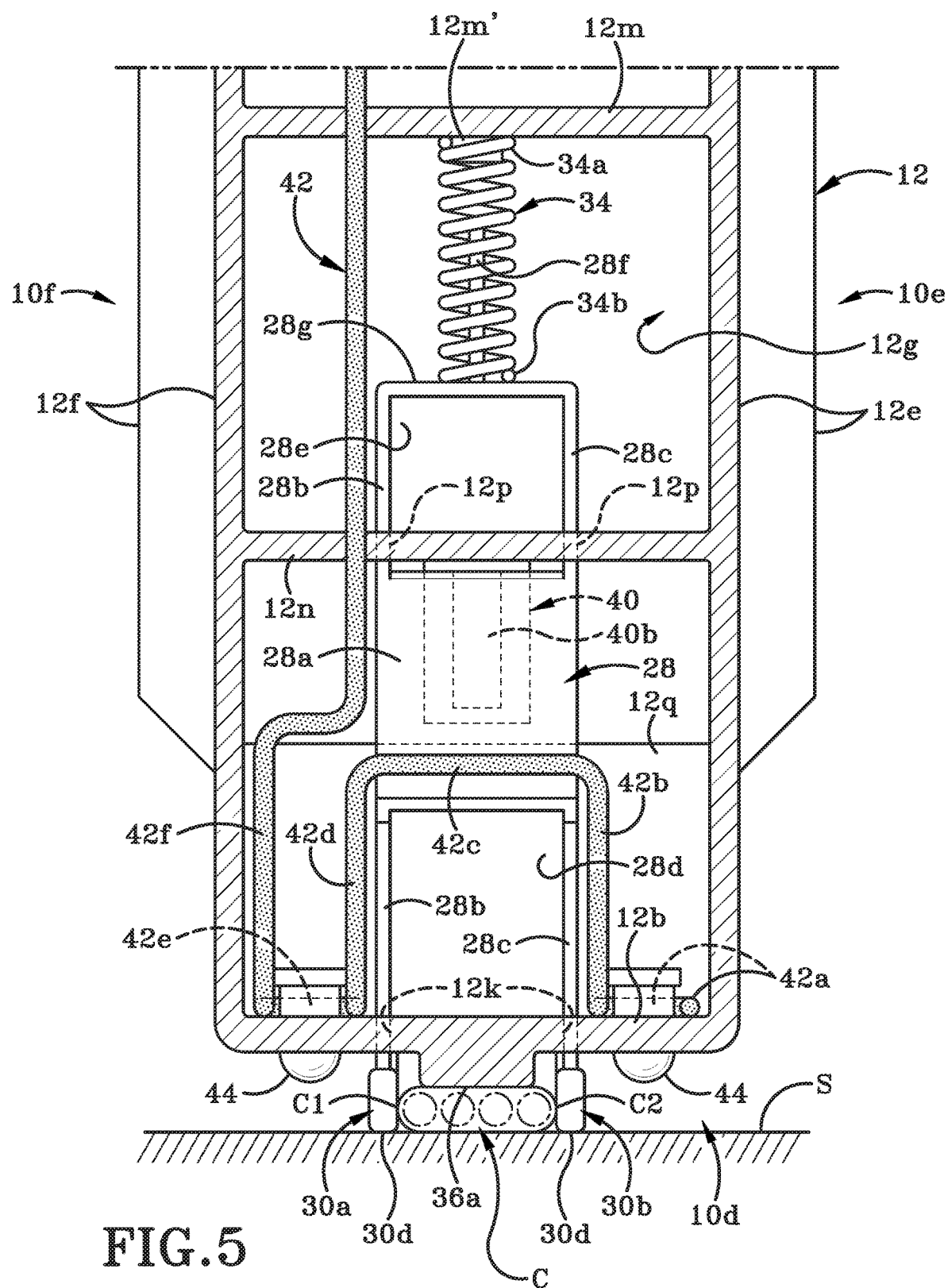
FIG. 5 is a cross-section of the staple gun in the second position taken along line 5-5 of FIG. 4.

FIG. 3 shows that first leg 28b and its associated first foot 30a are located generally a distance "D" away from second leg 28c and its associated second foot 30b and its associated leg 28c. The distance "D" is marginally larger than a width of a cable "C" that is to be received in the gap 28d. The width of cable "C" is measured from its left side "C1" to its right side "C2" as shown in FIG. 5.

Each foot 30a, 30b may be configured to be generally a truncated square-shaped component. In particular, an angled wall 30c (FIG. 8) of each foot 30a, 30b is oriented at an angle relative to a bottom wall 30d (FIG. 5) and a rear wall 30e (FIG. 8) of the associated foot 30a, 30b. In particular, the angled wall 30c is oriented at an angle α (FIG. 4) relative to the horizontal. The bottom wall 30d of each feet 30a, 30b is the wall that will rest upon a surface "S" to which a cable "C" is to be stapled in place with staple gun 10. The surface "S" may be any surface to which a cable "C" is to be secured with a staple, such as a wood stud in a building. First and second feet 30a, 30b may be placed on surface "S" and the width of the cable "C" may be retained between feet 30a, 30b as is illustrated in FIG. 5. Feet 30a, 30b may protect the ends of legs 28b, 28c of cable guide 28 and may be replaced if that is needed.

As best seen in FIG. 3, a shaft 28f extends outwardly from an upper region of the base and in an opposite direction to first leg 28b and second leg 28c. A horizontally-oriented interior wall 12m of housing 12 has a short post 12m' extending outwardly and downwardly therefrom. A compression spring 34 has a first end 34a and a second end 34b. The first end 34a of spring 34 is seated around post 12m' and second end 34b of spring 34 is seated around shaft 28f. Cable guide 28 is positioned within housing to move linearly in one of a first direction and a second direction. If a force is applied to cable guide 28 so that cable guide 28 is moved upwardly in the direction indicated by arrow "A" (FIG. 4), then the base of cable guide 28 moves toward interior wall 12m and compression spring 34 becomes compressed between interior wall 12m and the base. In other words, compression spring 34 moved to a compressed condition. The force that may be applied to cable guide 28 to move the same in the direction as arrow "A" is a reaction force to staple gun being position with feet 30a, 30b being placed in contact with surface "S" (FIG. 4) and the staple gun being pushed downwardly toward surface "S". The application of this reaction force causes cable guide 28 to move upwardly within interior cavity 12g and as a consequence the length of the legs 28b, 28c that extend below bottom wall 12b is effectively reduced. This can be seen by comparing the length of the leg 28c in FIGS. 2 & 3 and the length of leg 28c in FIGS. 4 & 5. (It should be noted that when cable guide 28 moves downwardly toward bottom wall 12b of housing 12, spring 34 moves from the compressed condition to an uncompressed condition; the spring 34 removes to its original length and shape.)

In order to limit the degree to which first and second legs 28b, 28c can be pushed into the interior cavity 12g, a spacer 36 is provided on a lower end of front wall 12c. Spacer 36 may be readily seen in FIG. 1 and FIG. 3. Spacer 36 may be integrally formed with front wall 12c of housing 12 and may be located forwardly of one or more apertures 12k through which legs 28b, 28c extend. Spacer 36 may be situated generally in alignment with the gap 28d that is defined between first leg 28b and second leg 28c of cable guide 28. Spacer may also be oriented generally at right angles to a longitudinal axis "Y" of housing 12. Spacer may also taper in size, particularly width, from proximate bottom wall 12b to a terminal end of spacer 36. The terminal end of spacer 36 may be planar and may be positioned on an upper surface of a stack of one or more cables "C" that are placed on surface "S".

Figure 6:
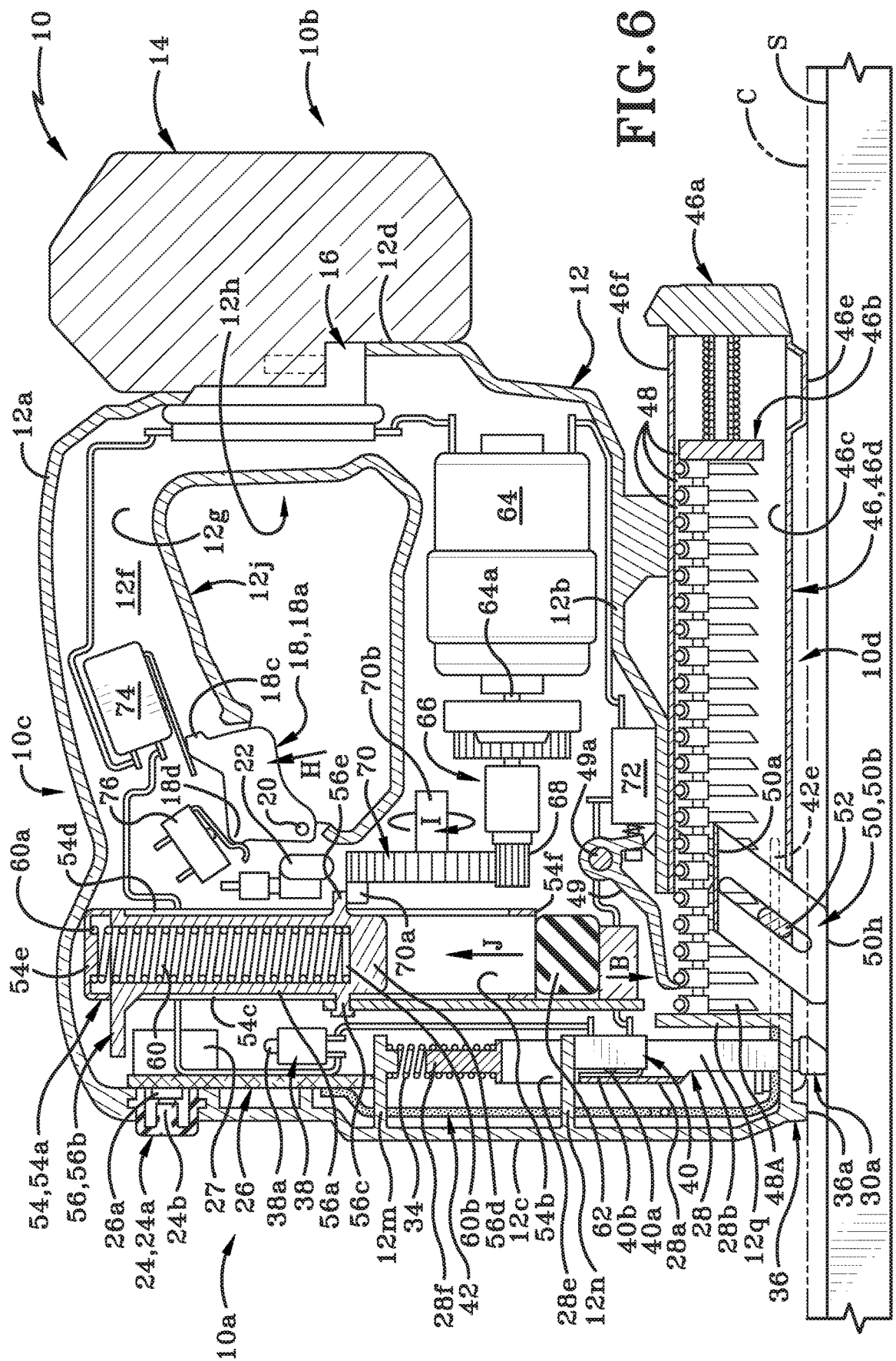
FIG. 6 is a longitudinal cross-section of the staple gun in a third position where the trigger has been depressed and the hammer is moved upwardly into a loaded position.
Figure 7:
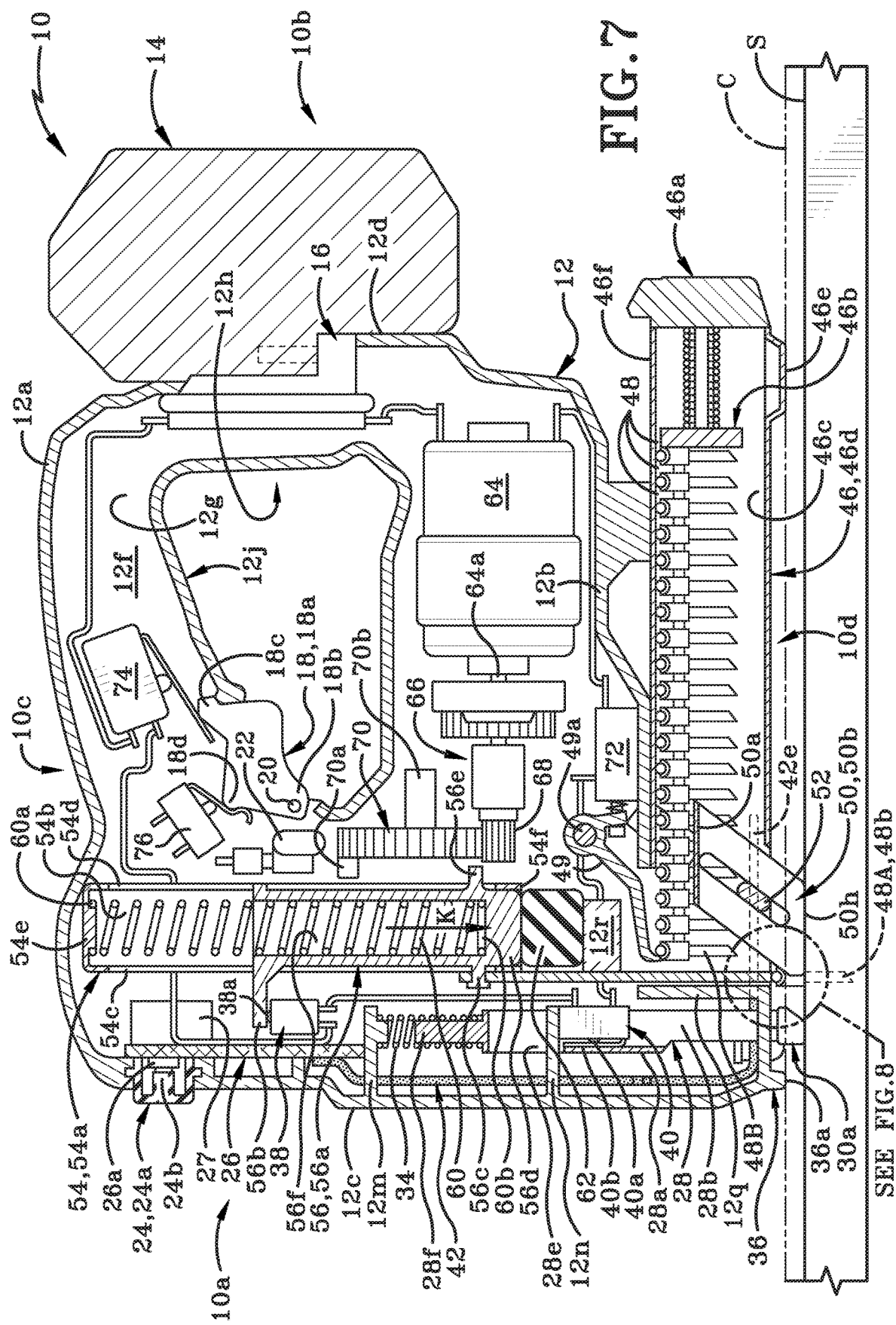
FIG. 7 is a longitudinal cross-section of the staple gun in a fourth position where the hammer moves downwardly and drives a staple into a surface.

A first limit switch 38 and a second limit switch 40 may be operatively engaged with each other via wiring (not numbered). First limit switch 38 may be mounted to housing 12 such that the first limit switch 38 is located a distance above interior wall 12m of housing 12 and adjacent a portion of PCB 26. First limit switch 38 includes a depressible button 38a (FIG. 6).

Second limit switch 40 may be mounted to housing 12 in a location beneath a second interior wall 12n (FIG. 2) and thus a distance vertically below first limit switch 38. Second limit switch 40 may include a depressible button 40a and a tab 40b that is pivotally mounted to a switch body. As best seen in FIG. 3, cable guide 28 defines an opening 28e therein that is positioned so that in some instance tab 40b will move from an open position (FIG. 2) to a closed position (FIG. 4) when part of the wall that defines opening 28e moves vertically in one direction over the tab 40b and forces the same to pivot toward the button 40a. When cable guide 28 moves in the same direction, one of the horizontally oriented walls that defines the opening 28e in cable guide 28 moves past the free end of tab 40b and tab 40b comes generally into alignment with opening 28e. Tab 40b may be sufficiently alignable with opening 28e that permits tab 40b to move from a closed position (FIG. 4) to an open position (FIG. 2). When tab 40b pivots to an open position as in FIG. 2, then the formerly depressed button 40a returns to its at-rest position. Second limit switch 40 is a safety limit switch that is provided in housing 12 adjacent cable guide 28 and is movable between an open position (FIG. 2) and a closed position (FIG. 4) by cable guide 28. Trigger 18 for the stapling mechanism is operatively engaged with this safety limit switch (i.e., second limit switch 40). When the safety limit switch 40 is in the open position, trigger 18 is inoperable and the stapling mechanism is unable to fire (i.e., drive) a staple through an aperture defined in bottom wall 12b. When safety limit switch 40 is in the closed position, the trigger 18 is operable and the stapling mechanism is operable and the stapling mechanism is able to fire (i.e., drive) the staple through the aperture and into surface "S".

A sensor probe 42 is provided in housing 12 in a region that bounds and surrounds the one or more apertures 12k (FIG. 3) in bottom wall 12b and through which first and second legs 28b, 28c of cable guide 28 extend. Sensor probe 42 includes a first section 42a, a second section 42b, a third section 42c, a fourth section 42d, a fifth section 42d, and a sixth section 42f. The sensor probe 42 may comprise a single cable that is bent into the differently shaped first through sixth sections 42a-42f. First section 42a and fifth section 42e may be generally horizontally oriented and may be located proximate bottom wall 12b, extending generally longitudinally adjacent side surfaces that define one or more apertures 12k in bottom wall 12b and for a distance rearwardly therefrom. Each of the first section 42a and fifth section 42e may bend around one of a plurality of light emitting diodes (LEDs) 44 that extend outwardly from bottom wall 12b. Second, third, and fourth sections 42b, 42c, 42d of sensor probe 42 together form a generally U-shaped region. The U-shaped region may be generally vertically oriented and be positioned generally at right angles to the first and fifth sections 42a, 42e. The U-shaped region may be located between a front surface of cable guide 28 and an interior surface of front wall 12c. The sixth section 42f of sensor probe may extend generally vertically upwardly adjacent the interior surface of front wall 12 and terminates in PCB 26. Sensor probe 42 is therefore also operatively engaged with override button 24 via PCB 26. Sensor probe 42 is a voltage sensor probe that is used to detect voltage passing through a cable "C" (FIG. 5) over which staple gun 10 is positioned to fire a staple. In other words, sensor probe 42 is provided to detect if the cable "C" is live. If voltage is detected in cable "C", the sensor probe 42 "tells" the PCB 26 that the cable "C" is live. The PCB 26 will prevent the user from firing over a live cable by not sending power to the motor 64 if the user tries to pull the trigger 18. PCB 26 will also activate the noise-generating mechanism 27 to make a first audible sound to alert the user to the fact that the cable is live. The first audible sound may be an audible beeping noise. PCB 26 will also activate LEDs 44 and cause the LEDs 44 to light up and emit a red light. The first audible sound and the red LEDs will alert the user to the fact that the cable "C" is carrying current and that additional caution is required when installing staples around the cable.

Override button 24 is provided to give the user an option to override the sensor probe 42. Should the user want to proceed and decide not to turn the power off i.e., to continue to install staples around a live cable "C", the user has the option to press and hold override button 24 for a pre-determined period of time. A suitable time for holding the depressed override button 24 may be three seconds. Holding override button 24 down for the pre-determined time causes the PCB to engage an "override" mode. Prior to holding down the override button 24, staple gun may be considered to be in a "safety mode". Holding override button 24 down will effectively move staple gun from the safety mode to the override mode. When switched into override mode, PCB 26 will cause the noise-generating mechanism 27 to make a second audible sound in the form of a short beep, for example, and will cause the LED's 44 to flash orange. Once staple gun 10 is in override mode, the user will be able to fire staples over the live cable "C". Noise-generating mechanism 27 may also no longer make a sound when the sensor probe 42 detects a live cable, but the LEDs 44 will still flash orange to ensure the user continues to be aware that the cable "C" is live.

The staple gun 10 will remain in override mode as long as the user leaves the gun on with the battery pack 14 engaged. Every time the staple gun 10 is power cycled (be it from the battery pack 14 being exchanged or the ON-OFF switch 22 being turned on or off) the staple gun 10 will start up in safety mode and therefore will have no ability to staple over live cables. The user will need to re-engage the override mode should they want or need to do so. If staple gun 10 is in override mode and the user pushes override button 24 for another pre-determined time, three seconds, for example, PCB will switch staple gun 10 back into the safety mode. The fact that staple gun is again in the safety mode will be indicated by the LED's 44 flashing green and the noise-generating mechanism 27 making a third audible sound. That third audible sound may be two long beeps for example.

It will be understood that the audible signals provided by noise-generating mechanism 27 can be programmed to be of any type or sound but desirably the sounds for the different modes and for the detection of a live cable should be sufficiently different to be audibly discernable by the user. It will further be understood that the visual signals provided to the user by the LEDs 44 may also be different from what has been described above, but again, the visual signals for the different modes and for the detection of a live cable should be sufficiently different to be easily and readily discerned by the user.

It should be noted that if noise-generating mechanism 27 makes a noise when staple gun 10 is being operated in safety mode and the user tries to staple over a live cable, the mechanism 27 will beep when sensor probe 42 detects a live cable and will continue to beep until the staple gun 10 is moved out of range of the live cable. Noise-generating mechanism 27 may also beep to indicate that the user is in override mode. In particular, the noise-generating mechanism 27 may make a longer beep when the user is in override mode versus a shorter or quicker beep that is made when sensor probe 42 detects a live cable and also when gun 10 is switched back to safety mode. In this latter instance, noise-generating mechanism 27 makes two long beeps.

The need to hold down override button 24 for a pre-determined time helps prevent accidental overriding of the safety mode. The need to hold down the override button 24 for a pre-determined time also ensures that the user deliberately switches staple gun 10 from safety mode into override mode.

As best seen in FIG. 3 and as mentioned above, one or more Light Emitting Diodes (LEDs) 44 are mounted within housing 12 so as protrude outwardly through openings in bottom wall 12b on either side of the opening through which the first and second legs 28b, 28c extend. LEDs 44 are part of the electrical circuit that is powered by battery pack 14. LEDs 44 will be illuminated when staple gun 10 is activated to fire a staple into surface "S" around a cable "C" (FIG. 5). LEDs 44 may effectively be positioned adjacent each of the first and second legs 28b, 28c of cable guide 28 to clearly illuminate the appropriate region of surface "S" into which a staple is to be fired by staple gun 10.

A staple magazine 46 forms part of the bottom 10b of staple gun 10 and may be formed as an integral part of housing 12. Magazine 46 extends longitudinally rearwardly from a short distance rearwardly of front wall 12c to proximate rear wall 12d of housing 12. Magazine 46 may be spaced a distance vertically below a portion of bottom wall 12b of housing 12. Magazine 46 may include a locking mechanism 46a that is located proximate rear end 10b of staple gun 10. A strip of staples 48, particularly insulated staples, may be loaded into magazine. A spring-loaded plate 46b may be provided to urge staples 48 retained within an interior cavity 46c of magazine forwardly toward front wall of housing 12 so that a first staple 48A is positioned to be driving by the stapling mechanism, followed by a second staple 48B. Each staple 48 may be generally U-shaped having an upper end 48a with a pair of arms 48b extending downwardly therefrom and terminating in sharp, nail-type tips. Each staple 48 may include insulation 48c (FIG. 8) around a portion of the staple's upper end 48a and/or arms 48b.

Magazine 46 may include a bottom wall 46d and a top wall 46f. Bottom 46d may be generally flush with the portion of bottom wall 12b of housing 12 that defines one or more apertures 12k therein except for a protrusion 46e that extends downwardly from an exterior surface of bottom wall 46d. Protrusion 46e may be integrally formed with bottom wall 46d or may be separately secured thereto. Protrusion 46e may extend from a left side wall of magazine 46 to a right side wall thereof and protrusion 46e may be of a greater width than spacer 36. Protrusion 46e may be oriented at right angles to longitudinal axis "Y". Spacer 36 and at least a portion of protrusion 46 may be longitudinally aligned with each other.

Protrusion 46 extends downwardly from bottom wall 12b of the housing (or bottom wall 46d of magazine 46) a distance rearwardly of spacer 36 and aperture 12k. Protrusion has a terminal end located a distance away from the bottom wall 12b, 46d that may be generally planar and is configured to rest on an upper surface of the stack of one or more cables "C" a distance rearwardly of where spacer 36 rests on the upper surface of the stack of one or more cables "C". The spacer 36 is of a height as measured from the wall 12b to a terminal end of the spacer 36, where the terminal wall rests on the upper surface of the uppermost one of the stack of one or more cables "C". The protrusion 46e is of a height that is measured from the wall 12b, 46d to a terminal end of the protrusion that rests on the upper surface of the uppermost one of the cables in the stack of one or more cables "C". The height of the spacer 36 and the height of the protrusion 46e are the same.

Although not illustrated herein, bottom wall 46c of magazine 46 may define two spaced apart slots (not shown) that are oriented longitudinally and are provided to receive first and second side walls 50b, 50c of a cable guard 50 therethrough as will be described later herein. Each slot originates a short distance rearwardly from interior wall 12q and extends for a further distance rearwardly from where it originates. These slots are generally parallel to each other and to a longitudinal axis "Y" (FIG. 1) of magazine 46. It will be understood that locking mechanism 46a may be selectively partially disengaged from magazine 46 in order to load a strip of staples 48 into interior cavity 46c of magazine 46.

As illustrated in FIG. 2, a molded strip of staples 48 may be retained within a track defined in staple magazine 46. The strip of staples 48 may be urged by the spring-loaded locking mechanism 46a toward front wall 12c of housing 12. One suitable type of staples 48 that may be retained and fired by staple gun 10 are staples that are suitable for securing ROMEX® electrical cables to a surface "S" such as a wooden stud. Staples 48, as is illustrated in the attached figures, may be of a type that includes regions of insulating material that is molded around portions of the staple. The strip of staples 48 may be oriented in magazine 46 such that the strip is substantially parallel to longitudinal axis "Y" (FIG. 1) of magazine 46 while the individual staples 48 are oriented at right angles to longitudinal axis "Y". A leading staple 48A is urged by locking mechanism 46a into a position where it is ready to be fired into surface "S" in order to secure cables or cables "C" thereto, as will be later described herein.

A staple load arm 49 (FIG. 2) is mounted via a pivot 49a to a portion of housing 12. Staple load arm 49 is pivotable in a direction indicated by arrow "B" (FIG. 6) to selectively engage a staple 48B that is positioned on the strip of staples 48 immediately behind leading staple 48A. When staple load arm 49 is pivoted into a staple-retaining position, shown in FIG. 6, a tip of staple load arm 49 contacts a portion of staple 48B and thereby prevents the strip of staples from moving forwardly toward front wall 12b.

Figure 4:
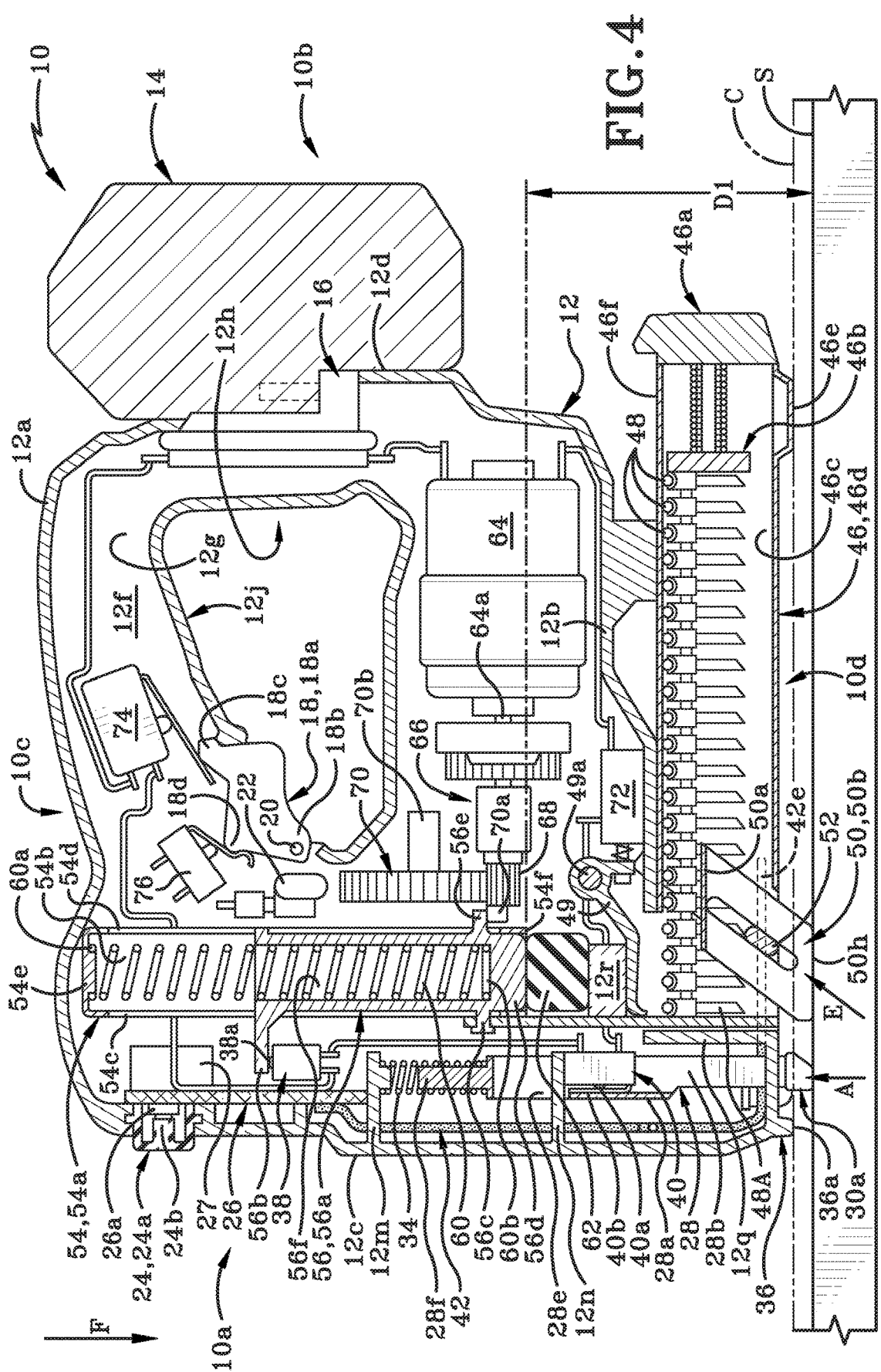
FIG. 4 is longitudinal cross-section of the staple gun in a second position where it is ready for use.

As can be seen from FIG. 4, for example, magazine 46 may define an interior cavity 46c within which staples 48 are held. Magazine 46 may further include a bottom wall 46d that has a protrusion 46e somewhere along the length of bottom wall 46d, preferably toward rear end 10b of staple gun 10. The protrusion 46e may be substantially the same height as spacer 36 so that staple gun 10 may be stable when seated on a surface "S", i.e., not wobbling side-to-side or back-to-front.

Figure 8:
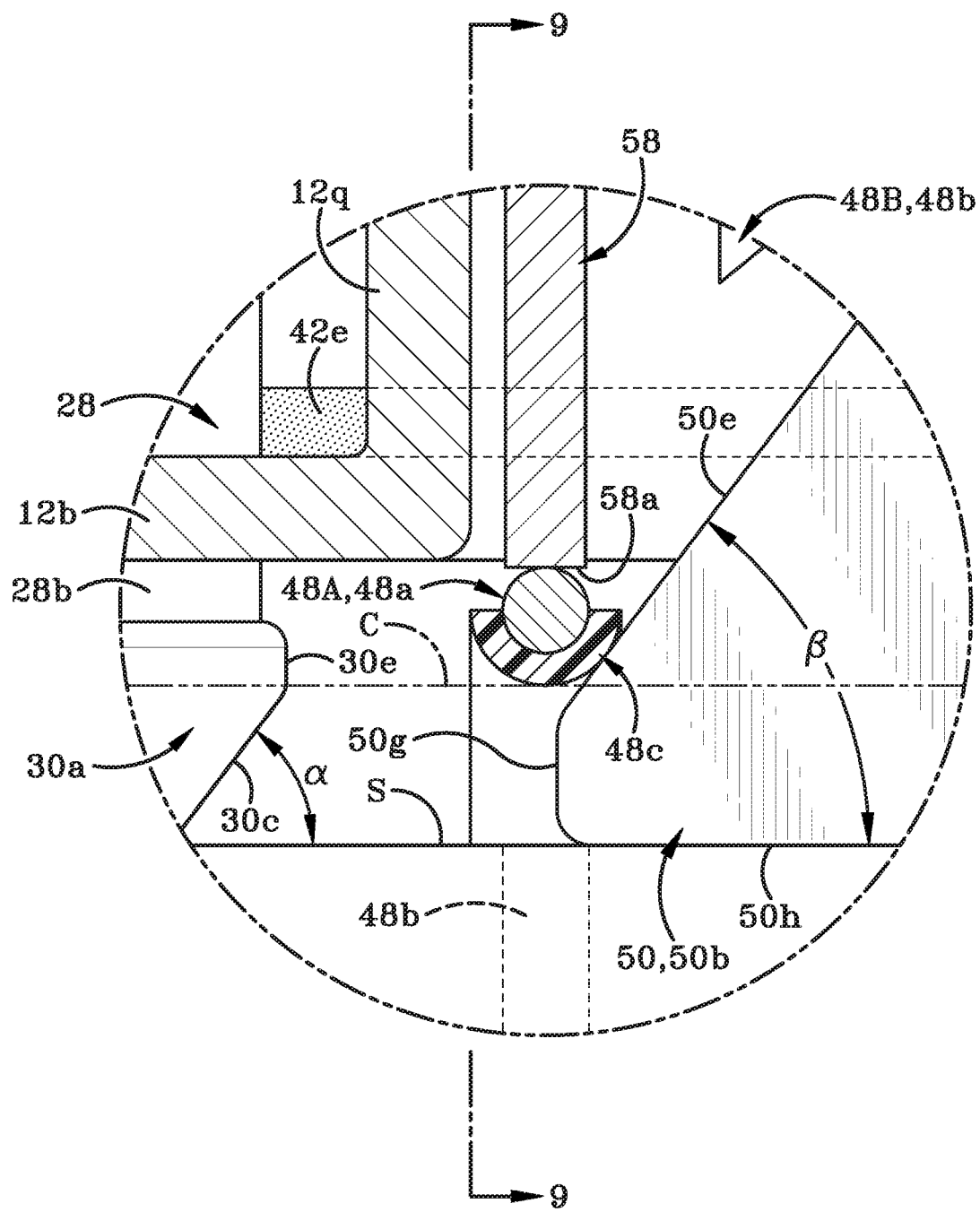
FIG. 8 is an enlarged view of the highlighted region of FIG. 7.

A further component that is partially received within an interior portion of the housing 12 and partially extends outwardly from the housing 12 is a spring-loaded cable guard 50. As shown in FIG. 9A, cable guard 50 may include a body that is generally a parallelogram in shape when viewed from a left side or right side of housing 12 as in FIG. 2. The body of cable guard 50 may be generally U-shaped when viewed from the front. The body may include a top wall 50a with first and second side walls 50b, 50c that extend downwardly from opposing ends of top wall 50a. Each side wall 50b, 50c defines a slot 50d therein, where the slot 50d extends between interior and exterior surfaces of the respective side wall 50b, 50c. Slot 50d may be oriented substantially parallel to one of the leading or trailing edges 50e, 50f of first and second side walls 50b, 50c. As can be seen in FIG. 8, edge 50e may be oriented at an angle β relative to the horizontal. The angle of the slot 50d may furthermore be oriented substantially at a same angle as edge 50e. The slots 50d in the two first and second side walls 50b, 50c may be substantially parallel to each other and aligned with each other. A fastener 52 may secure the body of cable guard 50 to side walls of magazine 46. A spring mechanism 53 (FIG. 2) may engage the body of cable guard 50 with a portion of magazine 46 or housing 12. Spring mechanism 53 may bias cable guard 50 toward extending outwardly beyond bottom wall 12b and thereby into contact with surface "S" when gun 10 is positioned adjacent surface "S". The first and second side walls 50b, 50c of cable guard 50 may extend outwardly through one or more slots (not shown) defined in bottom wall 46d of magazine 46. Spring mechanism 53 enables cable guard 50 to slide upwardly or downwardly along fasteners 52 and relative to bottom wall 46d of magazine 46 in a direction indicated by arrow "E" (FIG. 4) or in a direction opposite to arrow "E". In some instances more of the body of cable guard 50 is located within interior cavity 46c of magazine 46 and a lesser portion of the body of cable guard 50 extends downwardly through the one or more slots in the bottom wall 46d of magazine 46. In other instances, cable guard 50 slides downwardly relative to fastener 52 and more of the body of cable guard 50 extends downwardly beyond bottom wall 46d and less of the cable guard's body is retained within the interior cavity 46c of magazine 46. In other words, spring mechanism 53 enables cable guard 50 to move between an extended position and a retracted position relative to housing 12. Placing bottom edges 50h of first and second side walls 50b, 50c on surface "S" causes cable guard to move to a partially or fully retracted position and to move upwardly and inwardly relative to bottom wall 46d. This upward movement of cable guard 50 causes the spring in spring mechanism 53 to become compressed. Lifting staple gun 10 off surface "S" will allow the spring in spring mechanism 53 to return to an uncompressed state and this will result in cable guard moving outwardly and downwardly relative to bottom wall 46d and to the extended position.

One of the features of the feet 30a, 30b, and cable guard 50 is that the angle of angled wall 30c and the angle of the edges 50e, 50f may be substantially identical. This permits cable guard 50 to slide downwardly and forwardly relative to fastener 52 and tuck in behind angled wall 30c or inside of feet 30a, 30b without interfering with angled wall 30c.

A further feature of cable guard 50 is that the leading front corner regions 50g of the first and second first and second side walls 50b, 50c are truncated and do not continue along the same angle as the front edge 50e. Instead, the corner regions 50g include a front portion that is generally at right angles to the bottom edge 50h. The transitional areas between front edge 50e and front portion and between front portion and bottom edge 50h may be curved.

Referring to FIG. 4, staple gun 10 is provided with a guide assembly 54 and a reciprocating hammer 56 that travels upwardly and downwardly relative to guide assembly 54. Guide assembly 54 includes a vertically oriented tubular member 54a that may be generally rectangular or square in cross-section and is mounted within housing. Tubular member 54a bounds and defined a bore 54b that has an opening at bottom end through which a portion of the hammer 56 extends. The hammer 56 travels up and down within bore 54b. A front wall of tubular member 54a defines a first slot 54c therein and a rear wall of tubular member 54a defines a second slot 54d therein. Each of the first slot 54c and second slot 54d is in fluid communication with bore 54b.

Hammer 56 may comprise a generally tubular member 56a that is shaped and sized to be received within the bore 54b of guide assembly 54. Tubular member 56a of hammer 56 has a front wall that is proximate an interior surface of the front wall of tubular member 54a of guide assembly 54. Tubular member 56a of hammer has a rear wall that is proximate an interior surface of the rear wall of tubular member 54a of guide assembly 54.

A first flange 56b extends outwardly from the front wall of tubular member 56a. First flange 56b may be located proximate a top end of tubular member 56a. First flange 56b projects outwardly through first slot 54c of guide assembly 54. First flange 56b is of a sufficient length to come into contact with and depress button 38a on first limit switch 38 (as will be described later herein). First flange 56b may contact and depress button 38a on first limit switch 38 at substantially a same time as hammer 56 contacts bumper 62. The contact between first flange 56b and limit switch 38 may result in the stapling mechanism being deactivated.

A second flange 56c extends outwardly from the front wall of tubular member 56a of hammer 56. Second flange 56c may be located a distance upwardly from a bottom region 56d of tubular member 56a. Second flange 56c projects outwardly through first slot 54c of guide assembly 54 a distance vertically below first flange 56b. Second flange 56c may be of a shorter length than first flange 56c. A hammer plate 58 is positioned in contact with a front wall of tubular member 54a of guide assembly 54. Second flange 56c may extend through a hole (not numbered) defined in hammer plate 58 and fixedly secures hammer plate 58 to tubular member 56a of hammer 56. Hammer plate 58 therefore travels in unison with hammer 56 when hammer 56 is moved upwardly or downwardly within bore 54b of guide assembly 54.

Hammer plate 58 extends downwardly for a distance below a bottom end 56d of tubular member 56a of hammer 56 and terminates in a bottom edge 58a. Hammer plate 58 is oriented substantially parallel to the front wall of tubular member 56a and to the front wall of guide assembly 54. A guide wall 12q is provided on housing 12 to correctly position hammer plate 58. Guide wall 12q has a rear surface relative to which hammer plate 58 moves upwardly and downwardly. Hammer plate 58 travels downwardly with hammer 56 to a sufficient degree to contact an upper surface of staple 48 and drive the same through an aperture (not numbered) defined in bottom wall 12b (see FIG. 8).

A third flange 56e extends outwardly from a rear wall of tubular member 56a and projects through second slot 54d of guide assembly 54. Third flange 56e may be located a distance upwardly from bottom region 56d of tubular member 56a. Third flange 56e may be horizontally aligned with second flange 56c. The purpose of third flange 56e will be described later herein.

Tubular member 56a of hammer 56 defines a bore 56f therein. Bore 56f has an opening in a top end of tubular member 56a such that bore 56f is placed in fluid communication with interior chamber 54a of guide assembly 54. A compression spring 60 is received in interior chamber 54a and bore 56f such that a top end 60a of spring 60 contacts an upper wall 54e of tubular member 54a and a bottom end 60b of spring 60 contacts an interior surface of the bottom region 56d of hammer 56. Third flange 56e extends outwardly from second slot 54d in an opposite direction to second flange 56c.

A bumper 62 is positioned within bore 54b between an opening to bore 54b of guide assembly 54 and a region 12r of housing 12. Consequently, bumper 62 may be positioned between bottom region 56d of hammer 56 and region 12r of housing 12. Bumper 62 may be fabricated from any suitable cushioning material, such as rubber. Bumper 62 acts as a stop that limits the travel of hammer 56 in a downward direction within bore 54b. Bumper 62 also dampens the shock created when the hammer plate 58 strikes a staple 48A (which will be further described later herein). (It should be noted that not only does region 12r provide a mounting location for bumper 52 but region 12r also acts as a stop for staple load arm 49.) It should be noted that the spacer 36 and bumper 62 in combination set a lowermost position of terminal end 58a of hammer plate 58 relative to surface "S". The terminal end 58a of hammer plate 58 will not move past the lowermost position during a strike on staple. Spacer 36 sets a distance between the upper surface of the uppermost cable in the stack of one or more cables "C" and bumper 62 sets a point beyond which the hammer 56 will not move downwardly and therefore bumper 62 sets the lowest point down to which the hammer 56 and therefore the hammer plate 58 can move.

Referring to FIG. 6, staple gun 10 further comprises a motor 64 having a drive shaft 64a that is operably engaged with a gear assembly 66. (Some components of gear assembly 66 are omitted from the figures for the sake of simplicity and clarity.) Gear assembly 66 may include any number of gears that are configured to transfer motion from drive shaft 64a to hammer 56. In particular, gear assembly 66 may include a first gear 68 that drives a second gear 70. Second gear 70 may include a projection 70a extending outwardly from a side surface thereof. Projection 70a is offset from an axis of rotation of second gear 70 and extends outwardly therefrom to a sufficient degree to contact third flange 56e on hammer 56, as will be later described herein.

Motor 64 is operatively engaged with a solenoid 72. Solenoid 72 in turn is operatively engaged with second limit switch 40. Motor 64 is further operatively engaged with battery mounting 16, a third limit switch 74, and a fourth limit switch 76. Motor 64, solenoid 72, battery mounting 16, and the first, second, third and fourth limit switches 38, 40, 74, and 76 are all operatively engaged with PCB 26. Third limit switch 74 and fourth limit switch 76 are positioned to contact trigger 18. In particular, third limit switch 74 is placed in contact with second region 18c of trigger 18 and fourth limit switch 76 is placed in contact with third region 18d of trigger 18.

Staple gun 10 is used in the following manner. FIGS. 1-3 show staple gun 10 prior to positioning the same on a work surface. Cable guide 28 extends downwardly for a distance below bottom wall 12b of housing 12. Cable guard 50 extends for a distance below a bottom wall 46d of magazine 46. It should be noted that the feet 30a, 30b extend for a distance downwardly below spacer 36. Additionally, as can be seen in FIG. 2, second limit switch 40 is in a position where button 40a is not depressed because tab 40b is in an open position. Still further, hammer 56 is located in contact with bumper 62, and first flange 56a on hammer 56 is depressing button 38a on first limit switch 38. The springs 34 and 60 are both in an uncompressed condition. Staple load arm 49 is pivoted out of contact with any of the staples 48 in magazine 46.

Referring to FIGS. 4-9, the user then places staple gun 10 over a cable "C" that is resting on top of surface "S". FIG. 4 shows a stack of cables that comprises only a single cable "C" positioned on surface "S". In order to correctly position staple gun 10, the user will position first foot 30a adjacent a first side edge "C1" (FIG. 5) of cable "C" and will place second foot 30b adjacent a second side edge "C2" of cable "C". The width of cable "C" is thus captured in the gap 28c between first and second legs 28b, 28c of cable guide 28. Legs 28b, 28c of cable guide 28 aid in keeping cable "C" from slipping to the left or right on surface "S". If the cable did slip to the left or right, then when staple gun 10 is fired the cable might accidentally be pierced by a fired staple. Cable guide 28 helps reduce the possibility of this happening.

Additionally, bottom surface 50h of cable guard 50 is placed on surface "S" in such a way that the width of cable "C" is captured in the gap 50j between first and second first and second side walls 50b, 50c.

Once cable "C" is captured between first and second feet 30a, 30b of cable guide 28 and first and second first and second side walls 50b, 50c of cable guard 50, the user will push front end 10a of staple gun 10 downwardly toward surface "S" in the direction of arrow "F" (FIG. 4). As staple gun 10 moves downwardly, cable guide 28 is moved upwardly relative to bottom wall 12b of housing 12 in the direction of arrow "A" and cable guard 50 is moved upwardly relative to bottom wall 46d of magazine 46 in the direction of arrow "E".

The upward movement of cable guide 28 causes the base thereof to move relative to second limit switch 40, moving aperture 28e upwardly and causing the base to force tab 40b of second limit switch 40 to move to a closed position where tab 40b depresses button 40a of second limit switch 40. Additionally, the upward movement of cable guide 28 compresses spring 34.

The upward movement of cable guard 50 shifts the front corner regions 50g of cable guard rearwardly (i.e., in a direction away from front end 10a of staple gun 10) and to a position where the interior surfaces of the front corner regions 50g of cable guard 50 are positioned outside of each of the legs of the leading staple 48A.

Solenoid 72 activates staple load arm 49 to pivot downwardly in the direction of arrow "B" so that the tip of staple load arm 46 contacts a leading surface of second staple 48B and restrains second staple 48B from advancing toward front wall 12c.

Front end 10a of housing 10 is pushed downwardly until spacer 36 comes into contact with an upper surface of cable "C". Rear end 10b of housing 10 may be moved downwardly toward surface "S" and until protrusion 46e on magazine 46 comes to rest on the upper surface of cable "C" some distance rearwardly of spacer 36. As shown in FIG. 4, the upper surface of bumper 62 is retained a distance "D1" from the surface "S". Hammer 56 can travel no further downwardly toward surface "S" than this distance "D1". If bumper 62 was omitted from staple gun 10 and/or if spacer 36 was omitted from staple gun 10, hammer 56 would travel further downwardly within guide assembly 54 and would therefore drive staple 48A further into surface "S". There would then be a risk that staple 48A could cut into the insulation of cable "C" or crush a portion of cable "C".

At this point, user may depress trigger 18 by pushing the same in the direction of arrow "H" (FIG. 6). This motion activates one or both of third limit switch 74 and fourth limit switch 76 which then signal PCB 26 to send power to motor 64. Motor 64 starts turning drive shaft 64a and the motion thereof is ultimately transmitted to second gear 70 which starts to rotate in the direction of arrow "I". As second gear 70 rotates, projection 70a rotates in unison therewith and comes into contact with an underside of third flange 56e on hammer 56. Continued rotation of projection 70a causes third flange 56e to move vertically upwardly in a direction of arrow "J" within interior chamber 54a of guide assembly 54 from a first position shown in FIG. 2 to a second position shown in FIG. 6. As hammer 56 rises within bore 54b, spring 60 is compressed, i.e., is moved to a compressed condition. FIG. 6 shows hammer 56 having been loaded by motor 64 for firing.

Continued rotation of second gear 70 moves projection 70a out from under third flange 56e on hammer 56 and, as a result, hammer 56 is rapidly moved downwardly within bore 54b in the direction of arrow "K" (FIG. 7) as spring 60 returns to its original shape and length. Since hammer plate 58 is secured to hammer 56, as hammer 56 is moved downwardly in the direction of arrow "K", hammer plate 58 also moves downwardly in the direction of arrow "K". The terminal end 58a of hammer plate 58 strikes first staple 48A and drives first staple 48A into surface "S". In one example, hammer 56 may make only a single strike on staple "S". In other examples, motor 64 may reload hammer 56 and make one or more additional strikes on staple 48A.

Downward movement of hammer 56 and therefore of hammer plate 58, continues until bottom region 56d of hammer 56 strikes bumper 62. It should be noted that the downward travel of hammer 56 causes first flange 56a on hammer 56 to contact and depress button 38a on first limit switch 38. First limit switch 38 may signal PCB 26 to stop staple gun 10 from firing. Solenoid 72 may control staple load arm 49 to pivot to its at rest position (FIG. 2) and the locking mechanism 46a includes a spring-loaded plate 46b that urges the strip of staples forwardly so that the staple 48B becomes the leading staple in magazine 46. Solenoid 72 therefore aids in regulating staple advancement within magazine. Once staple 48B is loaded, staple gun 10 is once again in a position where it is ready to fire the next staple 48B into surface "S" in the manner described with reference to staple 48A.

It should be noted that bumper 62 sets how far into surface "S" the hammer 56 may hit staple 48A. In other words, bumper 62 limits the travel of hammer 56 in a downward direction and, as a result, staple 48A may only be driven into surface "S" to a particular set depth. The downward travel of hammer 56 stops at a certain spot that is higher off the surface "S" than if bumper 62 was omitted from staple gun. The distance of travel of hammer 56 within guide assembly 54 never changes. Additionally, the spacer 36 ensures the bottom 10d of staple gun 10 is retained a certain distance above the cable "C". The bottom 10d of staple gun 10 is therefore utilized to determine a depth to which the staple 48A will be driven into surface "S".

It should be noted that the presence of second limit switch 40 (which is a safety switch) helps to ensure that staple gun 10 cannot be fired unless and until the front end of the gun is resting on the upper surface of the cable "C". Until second limit switch 40 is moved to the closed position (FIG. 6), PCB 26 will not send power to motor 64 if the trigger 18 is depressed. Second limit switch 40 is cabled to cable guide 28 has legs 28b, 28c positioned one each side of the cable to be sure that the user does not accidentally run a staple through the cable.

Figure 9:
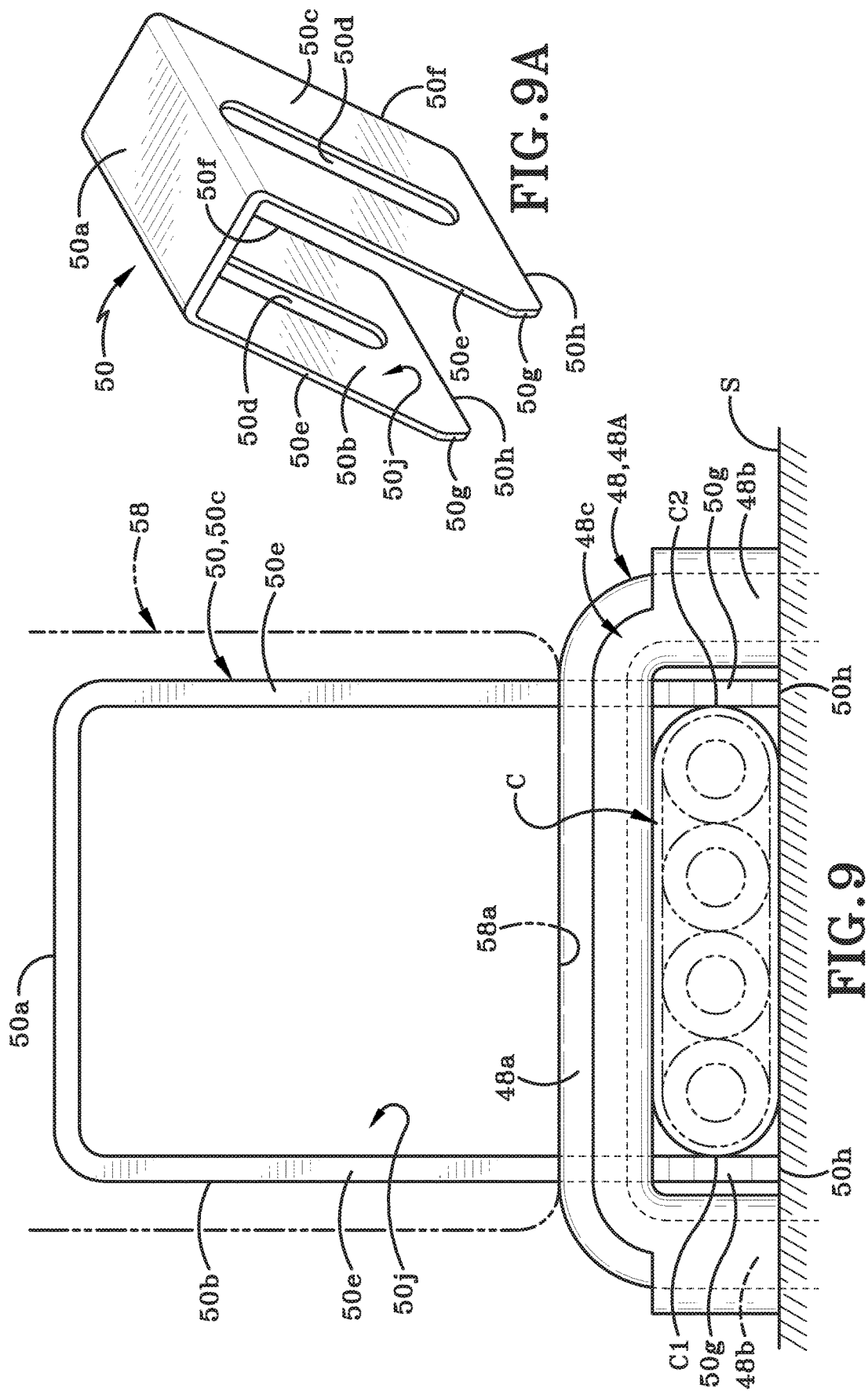
FIG. 9 is a partial cross-section of a front end of the staple gun taken along line 9-9 of FIG. 8.

Furthermore, as shown in FIG. 9, cable guard 50 is positioned so that corner regions 50g thereof are located between the left and right arms of staple 48A and the left and right sides "C1" and "C2" of cable "C". Consequently, cable guard 50 effectively covers the cable "C" right at a point where staple 48A will be driven into surface "S". Cable guard 50 is therefore a further safety feature that is provided on staple gun 10 to aid in ensuring that staple 48A will not accidentally nip or pierce the cable "C" or break the insulation around the cable.

Figure 10:
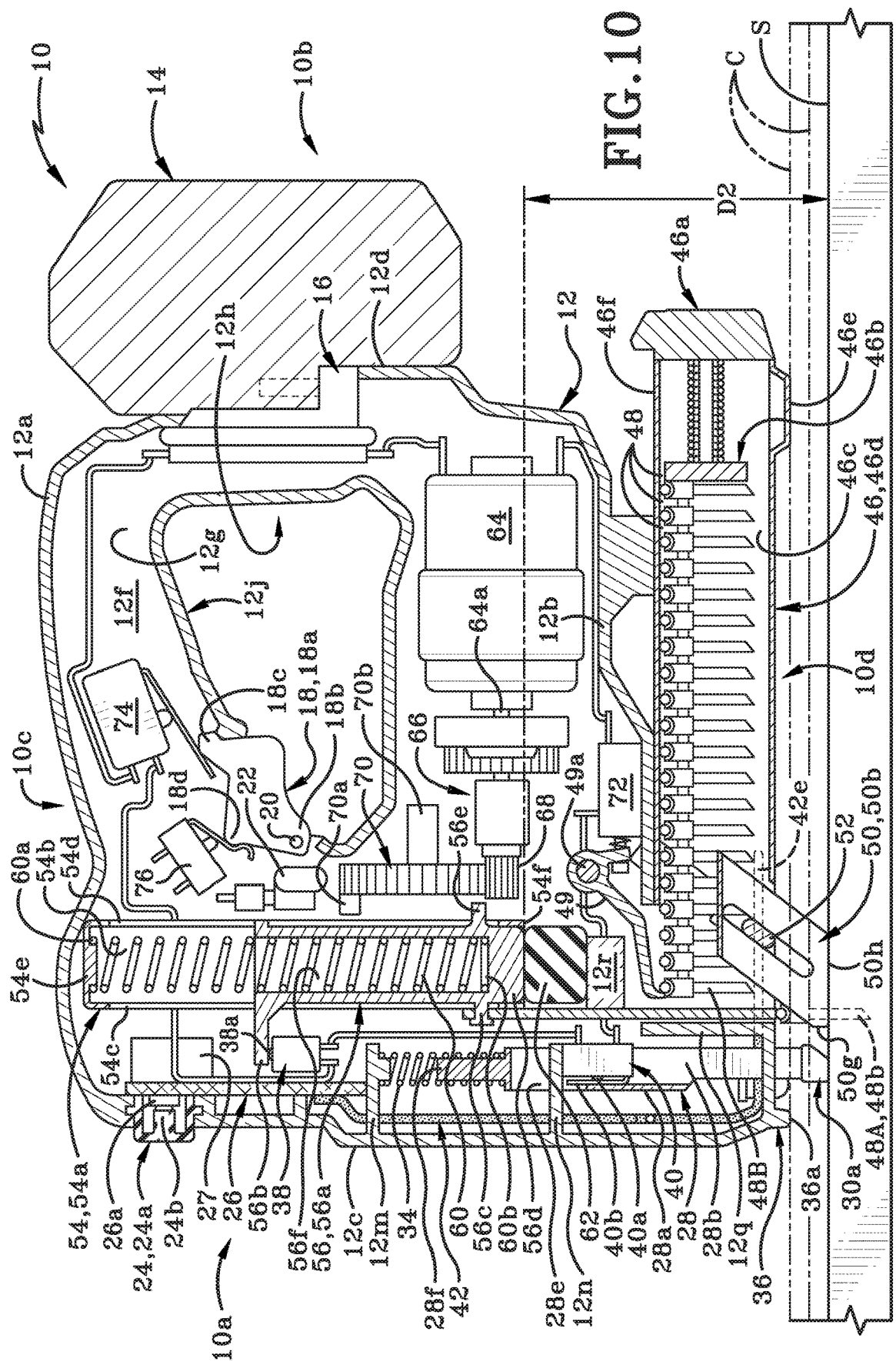
FIG. 10 is a longitudinal cross-section of the staple gun positioned over two electrical cables and being utilized to drive a staple into a surface.
Figure 11:
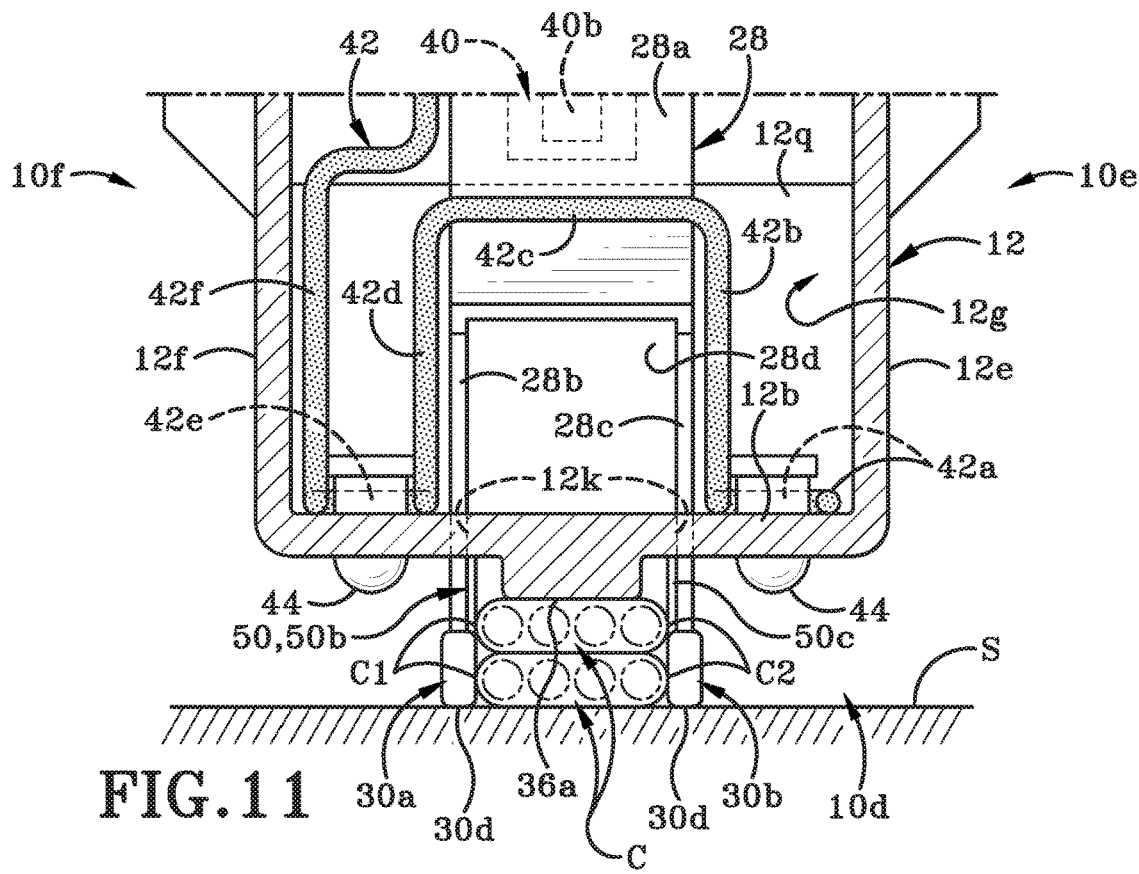
FIG. 11 is a cross-section of a lower front end of the staple gun positioned over a stack of two electrical cables.

FIG. 10 shows a stack of two cables "C" positioned one on top of the other on surface "S". Staple gun 10 is positioned to fire a staple 48A into surface "S" in exactly the same manner as described above with respect for firing a staple to secure a single cable on surface "S". So, in a first step, cable guide 28 is positioned so that first and second legs 28b, 28c of cable guide 28 capture the stack of two cables between them. First and second legs 28b, 28c keep the two cables stacked one on top of the other and prevent the cables from slipping to the left or right. It should be noted that when first and second feet 30a, 30b are placed on surface "S" and cable guide 28 is moved upwardly within housing 12 in the direction of arrow "A" (FIG. 4) as has been described earlier herein, cable guide 28 does not move upwardly within housing 12 to the same degree as when only one cable "C" rests on surface "S". Further, while bottom edge 50h of cable guard 50 is placed on surface "S so that the stack of two cables is captured between first and second first and second side walls 50b, 50c and cable guard 50 moves upwardly in the direction of arrow "A" (FIG. 4) as described earlier herein, cable guard 50 does not move upwardly to the same degree as when only one cable "C" is present on surface "S". It should be noted that in the circumstance shown in FIG. 10, cable guide 28 is moved upwardly to a sufficient degree that second limit switch 40 will be moved to a closed position and cable guard 50 will remain positioned between the sides of both of the two cables and the arms of leading staple 48A.

Once cable guide 28 and cable guard 50 are placed on surface "S", the staple gun 10 is moved downwardly until spacer 36 comes into contact with the upper surface of the topmost cable "C" in the stack. As before, the potential depth to which staple 48A may be driven into surface "S" is set as the distance between the top of the bumper 62 and the surface "S". This distance indicated as "D2" in FIG. 10, is greater than the distance "D1" (FIG. 4) that is set when only one cable is placed on the surface "S". Consequently, if the same length staple is used when there are two stacked cables as was used when only one cable was being stapled to surface "S", the same length staple will be driven to a lesser degree into that surface "S" when two cables are stacked on top of each other. A strip of staples that have longer arms may be loaded into magazine 46 if a stack of two cables is stapled to surface "S". The longer-arm staples may then be driven further into surface "S" by virtue of the fact that the arms of the staples are longer than those of staples required to secure only one cable in place.

Figure 13:
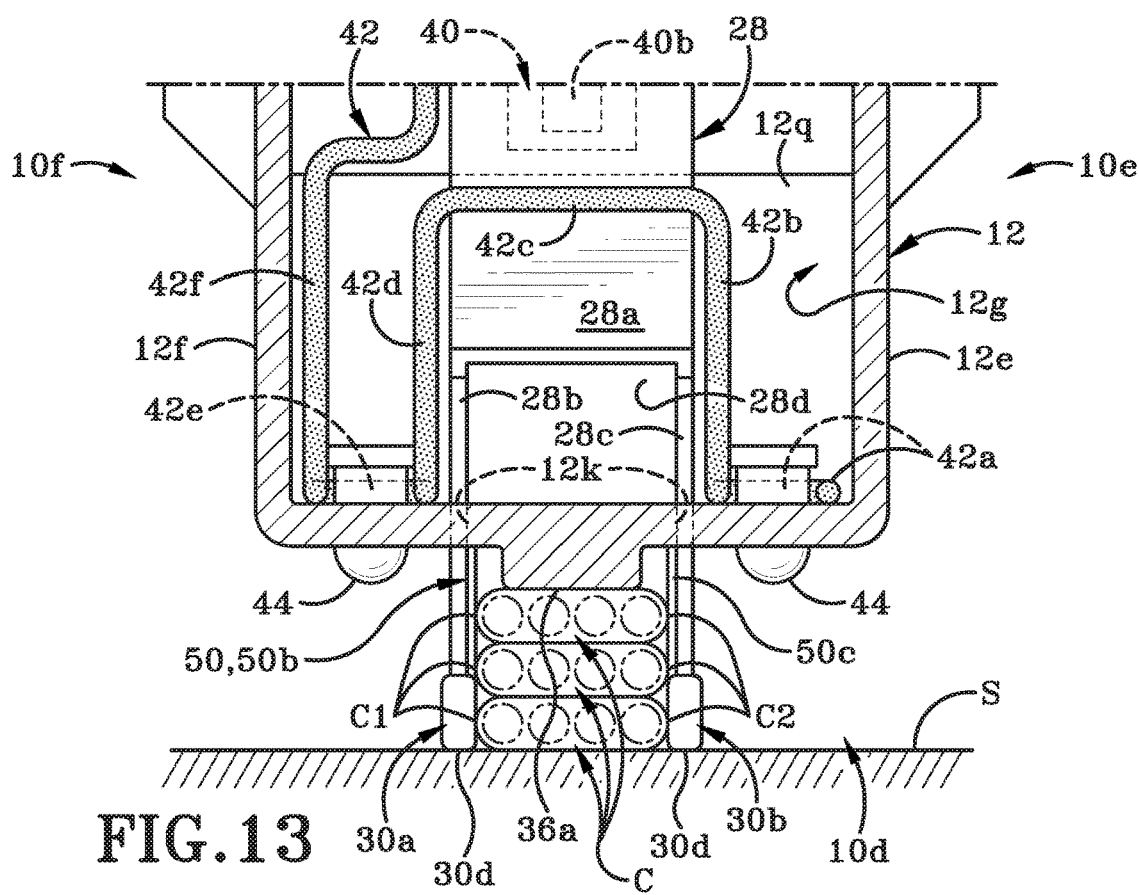
FIG. 13 is a cross-section of a lower front end of the staple gun positioned over a stack of three electrical cables.

FIGS. 12 and 13 show a stack of three cables being secured to surface "S" using staples 48 fired by staple gun 10. Staple gun 10 is placed into position with feet 30a, 30b of cable guide 28 resting on surface "S" and bottom edge 50h of cable guide 50 resting on surface "S". Spacer 36 of staple gun 10 rests on the upper surface of the top cable in the stack of three cables. Longer sections of the first and second legs 28b, 28c of cable guide 28 extend outwardly from housing 12 than when a single cable or two cables are placed on surface "S". A longer portion of cable guard 50 also protrudes below bottom wall 46d of magazine. The distance between the top of bumper 62 and surface "S" is shown as the distance "D3" (FIG. 12) and the distance "D3" is greater than the distances "D1" or "D2". The positioning of staple gun on the top of the uppermost cable therefore controls the extent to which hammer 56 may move downwardly toward surface "S" to drive staple 48A into surface "S". Longer-armed staples may be utilized to ensure that sufficient portions of the staple arms bite into surface "S".

As indicated above, one way staple gun 10 tends to stop staple 48A from going too far into surface "S" and therefore potentially cutting into cable "C" is by using an offset mechanism, namely, spacer 36 that allows staple 48A to only get hit into surface "S" to a particular depth. No matter how many cables are stacked one on top of the other, the spacer will take its "reading" from the uppermost cable in the stack of one or more cables. In other words, the spacer 36 indexes to the uppermost cable and not to the surface "S" into which staple 48A is being driven. Spacer 36 sets staple gun 10 at a consistent depth from an uppermost one of one or more cables "C".

Furthermore, the bottom 10d of staple gun 10 acts as a distance position indicator. In other words, when the bottom 10d of staple gun 10 lays on the upper surface of cable "C", it automatically spaces spacer gun 10 the right distance from the cable "C" to drive staple 48A only far enough into surface "S" so that staple 48A doesn't pinch cable "C". More particularly, hammer 56 contacts bumper 62 so that when the hammer 56 comes down and hits the bumper 62, hammer 56 can only go so far. So, when staple gun 10 is positioned on one length of ROMEX® cable "C", it drives staple 48A into surface "S" to the right distance, and on two stacked lengths of ROMEX® cable "C", the spacer 36 rests on the uppermost cable and the bumper 62 is spaced higher off surface "S" so that less of staple 48A is driven into the wood. Staple gun 10 is therefore provided with an automatic stop (i.e., bumper 62) that controls the depth to which any staples 48 are driven into surface "S". The ROMEX® cable "C" may be of any desired type and size but with a cable that is 9/16 inch wide, staples 48 that are above 1½ inches long can be used to secure a single cable in place on a surface "S". Staples 48 may be fired by staple gun to a sufficient depth to hold cable "C" firmly in place but without puncturing cable "C".

When a staple 48A has been fired into surface "S", the user may lift staple gun 10 off surface "S". When staple gun 10 is lifted upwardly, the cable guide 28 moves downwardly relative to housing 12 under the force of spring 34 returning to its uncompressed condition. As cable guide 28 moves downwardly the aperture 28e (FIG. 3) moves back into alignment with tab 40b of second limit switch 40 and tab 40b rotates back to its rest position as shown in FIG. 2. The circuit is broken when tab 40b moves to its rest position and if the user depresses trigger 18 nothing happens, i.e., the gun won't fire again. In order to fire the staple gun 10 again, the gun 10 has to be placed in contact with surface in such a manner that the cable guide 28 is moved upwardly once again within housing and to a point that tab 40b rotates to the closed position (FIG. 6) and the electrical circuit is closed once again.

It will be understood that housing 12 includes an interior cavity 12g within which a stapling mechanism is provided. The stapling mechanism comprises a plurality of components that all cooperate to fire or drive one or more staples 48 into surface "S" and around a stack of one or more cables "C". The stapling mechanism may include but may not be limited to the cable guide 28, cable guard 50, guide assembly 54, hammer 56, hammer plate 58, bumper 62, and various components of the drive train such as motor 64, gear assembly 66, solenoid 72, the PCB 28, wiring that operatively connects all of these components to each other and to battery pack 14, and all of the various limit switches, override button, noise-generating mechanism 27 etc.

Figure 14:
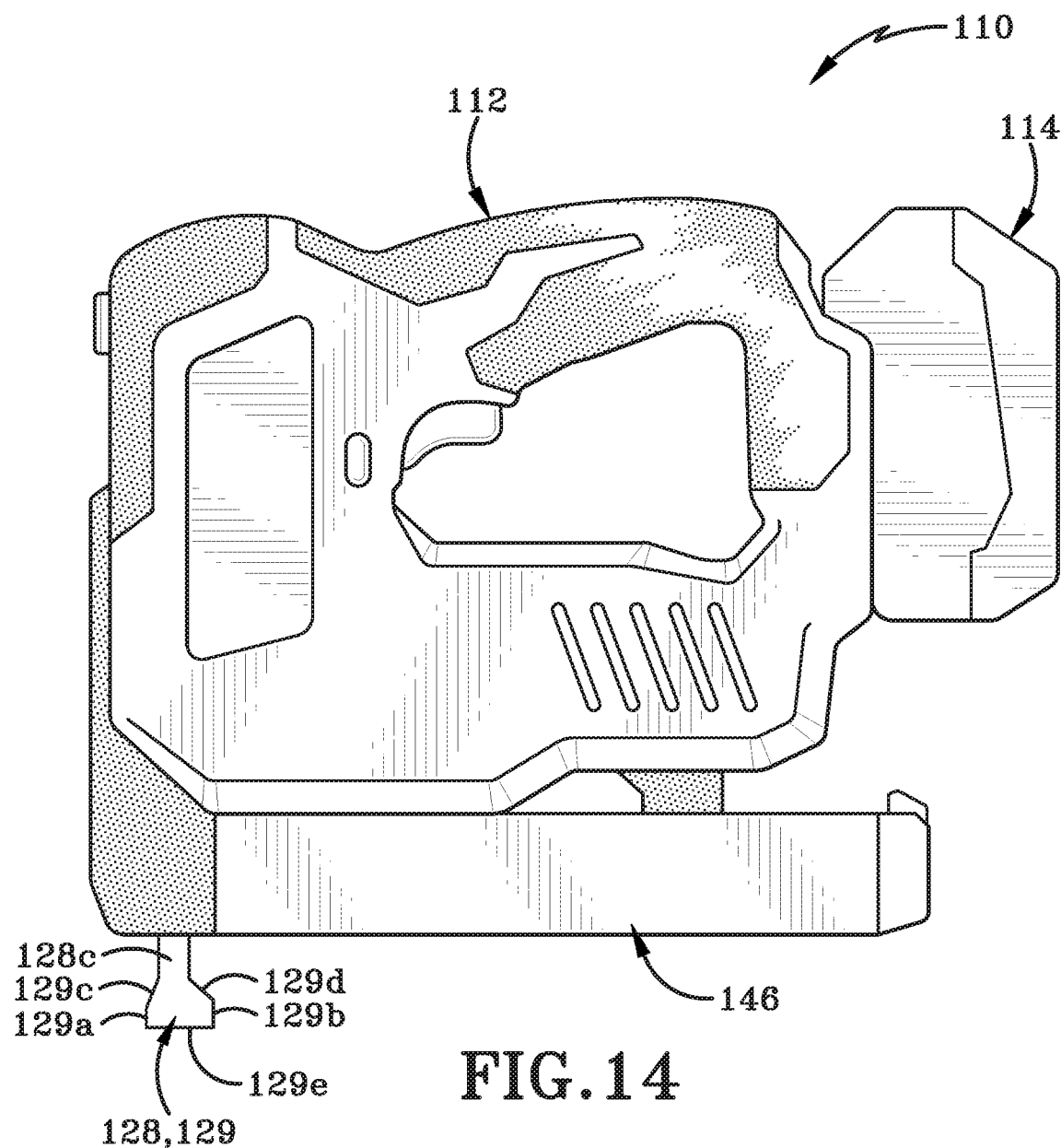
FIG. 14 is a side elevation view of a second embodiment of a staple gun in accordance with an aspect of the present disclosure.

Referring to FIG. 14 there is shown a second embodiment of a staple gun in accordance with the present disclosure, generally indicated at 110. Staple gun 110 is substantially identical to staple gun 10 and includes a housing 112 with a battery pack 114 engaged therewith. Housing 112 is substantially identical to housing 12 and battery back 114 is substantially identical to battery pack 14. Staple gun 110 differs from gun 10 in only a few ways. Firstly, the spacer 36 and the protrusion 46e are omitted from staple gun 110. Secondly, the cable guard 50 is omitted from staple gun 110. Thirdly, the cable guide utilized in staple gun 110 has first and second legs, such as leg 128c that has a different shaped bottom end from first leg 28b and 28c of the cable guide 28 in staple gun 10. In particular, the ends of legs, such as leg 128c does not include a foot of a different material thereon such as the foot 30b from leg 28c. The end of the cable guide's legs, such as leg 128c, includes an enlarged region 129 that has a front edge 129a, a rear edge 129b, a first angled edge 129c extending from front edge 129a to a front surface of leg 128c, a second angled edge 129d extending from rear edge 129b to a rear surface of leg 128c, and a bottom edge 129e. First angled edge 129d is oriented at a first obtuse angle (i.e., greater than ninety degrees) relative to the front surface of leg 128c and second angled edge 129e is oriented at a second obtuse angle relative to the rear surface of leg 128c. The first obtuse angle may be greater than the second obtuse angle or vice versa. In other examples, the first and second obtuse angles may be of the same size.

Apart from the differently configured terminal end of legs 128, the cable guide 128 in staple gun 110 has exactly the same structure and function as the cable guide 28 in staple gun 10.

While staple gun has been described herein as having a motor 64 and gear assembly 66 that control movement of hammer 56, it will be understood that other types of drive trains may be used instead of the motor and gear assembly to control the movement of hammer 56.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral" and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0. % of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, any method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed:

1. A staple gun comprising:
  a housing defining an interior cavity;
  a wall provided on the housing; said wall defining an aperture therein;

a stapling mechanism provided in the interior cavity of the housing; said stapling mechanism being adapted to deliver a staple through the aperture and over a stack of one or more cables resting on a surface; wherein the stapling mechanism includes:
  a hammer that is movable in one of a first direction and a second direction relative to the wall; said hammer being adapted to strike the staple and drive the same into the surface when moving in the second direction;
  a resilient bumper spaced a distance inwardly from an interior surface of the wall; wherein the bumper is contacted by the hammer and stops movement of the hammer in the second direction during the strike of the hammer on the staple; and
a spacer extending downwardly from the wall of the housing in a location forwardly of the aperture and generally centrally between a left side and a right side of the wall; said spacer being adapted to rest upon an uppermost cable of the stack of one or more cables.

2. The staple gun according to claim 1, wherein the spacer is integrally formed with the wall of the housing that defines the aperture.

3. The staple gun according to claim 2, wherein the hammer includes a hammer plate having a terminal end that is adapted to contact the staple and drive the staple into the surface; and wherein the spacer and the bumper in combination set a lowermost position of the terminal end of the hammer plate relative to the surface.

4. The staple gun according to claim 3, further comprising a protrusion extending outwardly from the wall of the housing that defines the aperture; wherein the protrusion is located a distance longitudinally away from the spacer; and wherein the protrusion is adapted to rest on the upper surface of the stack of one or more cables a distance away from the spacer.

5. The staple gun according to claim 4, wherein the spacer has a height measured from the wall of the housing to a terminal end of the spacer; and the protrusion has a height measured from the wall of the housing to a terminal end of the protrusion; and the height of the spacer and the height of the protrusion are substantially the same.

6. A staple gun comprising:
  a housing defining an interior cavity;
  a wall provided on the housing; said wall defining an aperture therein;
  a stapling mechanism provided in the interior cavity of the housing; said stapling mechanism being adapted to deliver a staple through the aperture and over a stack of one or more cables resting on a surface; wherein the stapling mechanism includes:
    a hammer that is movable in one of a first direction and a second direction relative to the wall; said hammer being adapted to strike the staple and drive the same into the surface when moving in the second direction; and
    a resilient bumper spaced a distance inwardly from an interior surface of the wall; wherein the bumper is contacted by the hammer and stops movement of the hammer in the second direction during the strike of the hammer on the staple; and
  a guide assembly having a guide wall with an interior surface that defines a bore; wherein the hammer is located within the bore and the resilient bumper is positioned below an opening to the bore of the guide assembly.

7. The staple gun according to claim 6, where the guide wall defines a slot therein that extends between an exterior surface of the guide wall and the interior surface of the guide wall; wherein the slot is in communication with the bore; and wherein a hammer plate is secured to the hammer by a fastener that extends through the slot; and the hammer plate is adapted to strike the staple.

8. The staple gun according to claim 6, wherein the guide wall defines a slot therein that extends between an exterior surface of the guide wall and the interior surface of the guide wall; wherein the slot is in communication with the bore; and wherein the hammer includes a flange extending outwardly therefrom and through the slot; and wherein a limit switch is mounted within the interior cavity in a position where the limit switch is contacted by the flange at substantially a same time as the hammer contacts the bumper, and wherein contact between the flange and the limit switch deactivates the stapling mechanism.

9. A staple gun comprising:
  a housing defining an interior cavity;
  a wall provided on the housing; said wall defining an aperture therein;
  a stapling mechanism provided in the interior cavity of the housing; said stapling mechanism being adapted to deliver a staple through the aperture and over a stack of one or more cables resting on a surface; and
  a spacer extending downwardly for a distance beyond the wall of the housing that defines the aperture; wherein the spacer is located forwardly of the aperture; and wherein the spacer is adapted to rest on an upper surface of the stack of one or more cables and to retain the wall of the housing a distance from the surface that is equivalent to a height of the spacer plus a height of the stack of one or more cables.

10. The staple gun according to claim 9, further comprising a protrusion extending outwardly from the wall of the housing that defines the aperture; wherein the protrusion is located a distance rearwardly and longitudinally away from the spacer; and wherein the protrusion is adapted to rest on the upper surface of the stack of one or more cables a distance away from the spacer.

11. The staple gun according to claim 10, wherein the spacer has a height measured from the wall of the housing to a terminal end of the spacer; and the protrusion has a height measured from the wall of the housing to a terminal end of the protrusion; and the height of the spacer and the height of the protrusion are substantially the same.

12. The staple gun according to claim 11, further comprising at least one light emitting diode (LED) provided on the housing and directing light toward the surface.

13. The staple gun according to claim 12, further comprising a printed circuit board (PCB) operatively engaged with and programmed to control the LED.

14. The staple gun according to claim 13, further comprising an override button operatively engaged with the PCB; and where the PCB changes a color of light emitted by the LED when the override button is engaged.

15. A staple gun comprising:
  a housing defining an interior cavity;
  a wall provided on the housing; said wall defining an aperture therein;
  a stapling mechanism provided in the interior cavity of the housing; said stapling mechanism being adapted to deliver a staple through the aperture and over a stack of one or more cables resting on a surface;
  a spacer extending downwardly for a distance beyond the wall of the housing that defines the aperture; wherein the spacer is adapted to rest on an upper surface of the stack of one or more cables and to retain the wall of the housing a distance from the surface that is equivalent to a height of the spacer plus a height of the stack of one or more cables; and
a sensor probe extending along at least a portion of the wall of the housing, said sensor probe being adapted to detect voltage in the stack of one or more cables.

* * * * *